United States Patent [19]
Hori et al.

[11] Patent Number: 5,550,925
[45] Date of Patent: Aug. 27, 1996

[54] SOUND PROCESSING DEVICE

[75] Inventors: Taizou Hori, Kanagawa-ken; Hideaki Fujimoto, Chiba-ken; Hirokazu Mogi, Saitama-ken; Yasumasa Ono, Tokyo, all of Japan

[73] Assignee: Canon Kabushiki Kaisha, Tokyo, Japan

[21] Appl. No.: 814,562

[22] Filed: Dec. 30, 1991

[30]     Foreign Application Priority Data

| Jan. 7, 1991 | [JP] | Japan | 3-000219 |
| Jan. 7, 1991 | [JP] | Japan | 3-000220 |
| Jan. 7, 1991 | [JP] | Japan | 3-000221 |
| Jan. 7, 1991 | [JP] | Japan | 3-000225 |
| Jan. 7, 1991 | [JP] | Japan | 3-000226 |
| Jan. 7, 1991 | [JP] | Japan | 3-000227 |
| Jul. 8, 1991 | [JP] | Japan | 3-167021 |
| Oct. 7, 1991 | [JP] | Japan | 3-259137 |
| Oct. 7, 1991 | [JP] | Japan | 3-259138 |
| Oct. 7, 1991 | [JP] | Japan | 3-259140 |
| Oct. 7, 1991 | [JP] | Japan | 3-259141 |

[51] Int. Cl.$^6$ ...................................................... H03G 5/00
[52] U.S. Cl. .................................................................. 381/98
[58] Field of Search ................................... 381/1, 94, 106, 381/98, 101, 102

[56]               References Cited

U.S. PATENT DOCUMENTS

| 4,363,006 | 12/1982 | Ishigaki et al. | 381/94 |
| 4,647,876 | 3/1987 | Waller, Jr. | 381/106 |
| 4,750,207 | 6/1988 | Gebert et al. | 381/94 |
| 4,866,774 | 9/1989 | Klayman | 381/1 |
| 5,018,205 | 5/1991 | Takagi et al. | 381/98 |
| 5,168,526 | 12/1992 | Orban | 381/100 |
| 5,172,358 | 12/1992 | Kimura | 381/102 |

*Primary Examiner*—Forester W. Isen
*Attorney, Agent, or Firm*—Robin, Blecker, Daley & Driscoll

[57]               ABSTRACT

A sound processing device for processing sound is arranged to control an attenuation characteristic for attenuating the low-frequency signal of an input audio signal according to the level thereof, whereby it is possible to suppress a noise component contained in sound without substantial impairment in auditory sound quality.

13 Claims, 26 Drawing Sheets

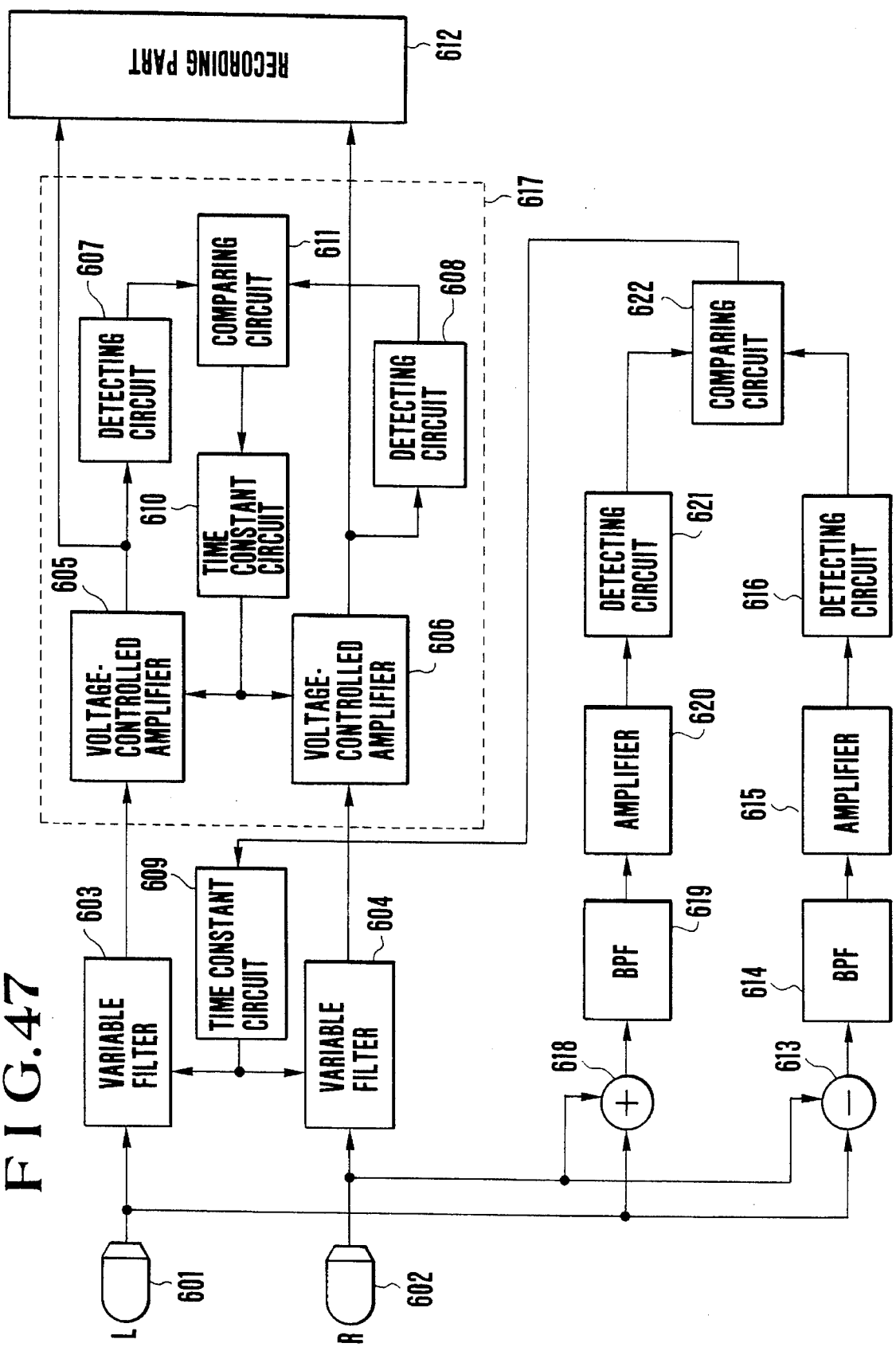

SOUND PROCESSING DEVICE

BACKGROUND OF THE INVENTION

1. Field of the Invention:

The present invention relates to a sound processing device for processing sound.

2. Description of the Related Art:

A sound recording device for converting sound into an electrical signal through a microphone or the like to form an audio signal and recording the formed audio signal on a recording medium by a tape recorder or the like has heretofore been known as one kind of device for processing sound.

In such a sound recording device, it is customary to use an audio-signal amplifying circuit having a substantially fixed frequency characteristic for amplifying the audio signal generated from the microphone. In this arrangement, if wind or the like blows against the microphone, noise due to the wind is introduced into sound to be recorded and the audio signal is degraded. For this reason, a wind screen or the like has conventionally been attached to the microphone to prevent the influence of the wind.

Because of the frequency characteristic of the aforesaid noise due to wind, which is a signal of low frequency, it has recently been proposed to provide an arrangement with a selecting switch for selectively switching frequency characteristics so that a low-frequency component can be eliminated from an audio signal. If wind is blowing during photography, an operator operates the selecting switch to actuate the audio-signal amplifying circuit to eliminate the low-frequency component from the audio signal so as to eliminate the influence of the wind.

However, the arrangement of the aforesaid device which uses the wind screen to prevent the influence of wind has the problem that the size of the device increases.

The arrangement in which an operator arbitrarily operates the selecting switch to actuate the audio signal amplifying circuit to eliminate the low-frequency component from the audio signal so as to prevent the influence of wind has the problem that it is very difficult for the operator to correctly determine whether wind is blowing and operate the selecting switch. There is also the possibility that the operator may erroneously operate the selecting switch.

In other words, to determine how the influence of the wind is, the operator needs to monitor the sound collected by the microphone at all times during photography. Such an arrangement is awkward for the operator to use.

If the operator operates the selecting switch without monitoring sound, a number of problems will occur. For example, while wind is blowing against the microphone, if the operator does not operate the selecting switch to eliminate the low-frequency component of the audio signal generated from the microphone, the level of noise due to the wind becomes high compared to the level of sound to be recorded. As a result, an AGC (Automatic Gain Controller) in the audio signal amplifying circuit may operate to lower the level of the entire sound collected by the microphone, by the influence of the noise due to the wind. While wind is not blowing against the microphone, if the operator erroneously operates the selecting switch to eliminate the low-frequency component of the audio signal, the low-frequency component of the sound collected by the microphone will be eliminated consistently during photography, with the result that the quality of the sound to be recorded is impaired.

SUMMARY OF THE INVENTION

It is, therefore, an object of the present invention to provide a sound processing device capable of solving the above-described problems.

Another object of the present invention is to provide a sound processing device capable of easily suppressing a noise component contained in sound by means of a simple arrangement and construction.

To achieve the above-described objects, according to one aspect of the present invention, there is provided a sound processing device for processing sound which comprises low-frequency attenuating means for receiving an audio signal as its input, attenuating a low-frequency signal of the input audio signal and outputting a resultant audio signal, and controlling means for controlling an attenuation characteristic in the low-frequency attenuating means, according to a level of the input audio signal.

Another object of the present invention is to provide a sound processing device capable of suppressing a noise component contained in sound without substantial impairment in auditory sound quality.

To achieve the above-described object, according to another aspect of the present invention, there is provided a sound processing device for processing sound which comprises low-frequency attenuating means for receiving an audio signal as its input, attenuating a low-frequency signal of the input audio signal and outputting a resultant audio signal, and controlling means for controlling an attenuation characteristic in the low-frequency attenuating means, according to a level of the low-frequency signal in the input audio signal and a level of a middle-frequency signal in the input audio signal.

Another object of the present invention is to provide a sound processing device capable of easily suppressing a noise component contained in stereophonic sound by means of a simple arrangement and construction.

To achieve the above-described object, according to another aspect of the present invention, there is provided a sound processing device for processing sound which comprises first low-frequency attenuating means for receiving a first audio signal as its input, attenuating a low-frequency signal of the input first audio signal and outputting a resultant audio signal, second low-frequency attenuating means for receiving a second audio signal as its input, attenuating a low-frequency signal of the input second audio signal and outputting a resultant audio signal, and controlling means for controlling attenuation characteristics in the respective first and second low-frequency attenuating means, according to levels of the low-frequency signals of the respective input first and second audio signals and levels of middle-frequency signals of the respective input first and second audio signals.

Another object of the present invention is to provide a sound processing device capable of easily suppressing a noise component due to wind by means of a simple arrangement and construction.

To achieve the above-described object, according to another aspect of the present invention, there is provided a sound processing device for processing sound which comprises wind sensing means for sensing a strength of wind, low-frequency attenuating means for receiving an audio signal as its input, attenuating a low-frequency signal of the input audio signal and outputting a resultant audio signal, and controlling means for controlling an attenuation characteristic in the low-frequency attenuating means, according to the strength of the wind sensed by the wind sensing means.

Another object of the present invention is to provide a sound processing device capable of reliably informing an operator of the occurrence of a noise component in sound.

To achieve the above-described object, according to another aspect of the present invention, there is provided a sound processing device for processing sound which comprises display means for receiving an audio signal as its input and providing a warning indication according to a level of the low-frequency signal of the input audio signal.

Another object of the present invention is to provide a sound processing device capable of easily suppressing a noise component due to wind in stereophonic sound by means of a simple arrangement and construction.

To achieve the above-described object, according to another aspect of the present invention, there is provided a sound processing device for processing sound which comprises first frequency-characteristic varying means for receiving a first audio signal as its input, varying a frequency characteristic of the input first audio signal and outputting a resultant audio signal, second frequency-characteristic varying means for receiving a second audio signal as its input, varying a frequency characteristic of the input second audio signal and outputting a resultant audio signal, and controlling means for controlling characteristics of the respective first and second frequency-characteristic varying means, according to a level of a low-frequency component of a difference signal of the input first and second audio signals.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 47 is a block diagram schematically showing the arrangement and construction of a sound recording device according to a twenty-second embodiment of the present invention.

DETAILED DESCRIPTION OF THE PREFERRED EMBODIMENTS

Preferred embodiments of the present invention will be described below with reference to the accompanying drawings.

Figure 1:
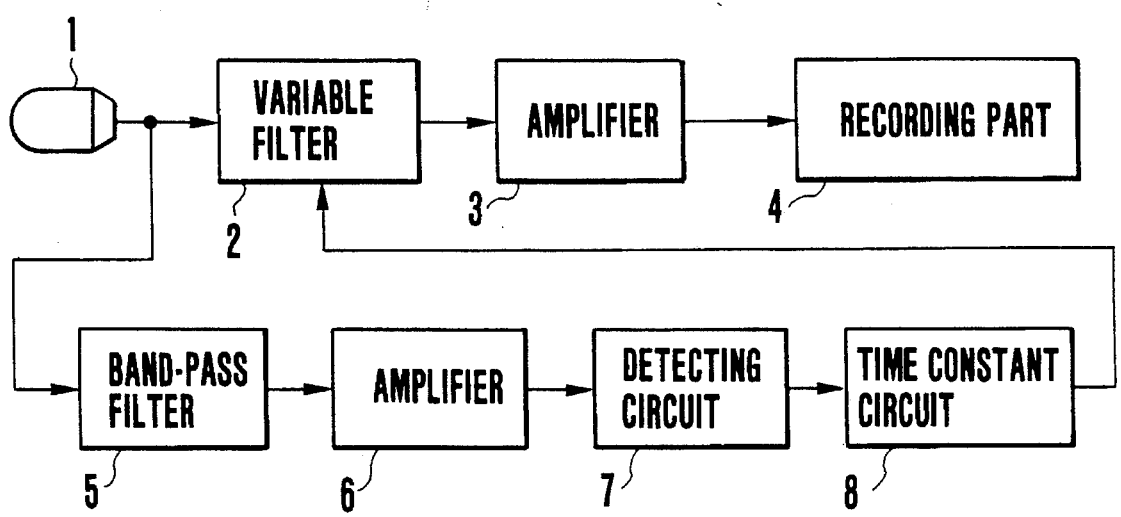
FIG. 1 is a block diagram schematically showing the arrangement and construction of a sound recording device according to a first embodiment of the present invention.

FIG. 1 is a block diagram schematically showing the arrangement and construction of a sound recording device according to a first embodiment of the present invention.

The arrangement shown in FIG. 1 includes a microphone 1 for converting sound into an electrical signal, a variable filter 2 for varying the frequency characteristic of an audio signal generated from the microphone 1, an amplifier 3 for amplifying the audio signal outputted from the variable filter 2, a recording part 4 for recording the audio signal amplified by the amplifier 3 on a recording medium such as a magnetic tape, a band-pass filter (BPF) 5 for separating a low-frequency component from the audio signal generated from the microphone 1, an amplifier 6 for amplifying the signal separated by the BPF 5, a detecting circuit 7 for detecting the low-frequency component signal of the audio signal amplified by the amplifier 6 and outputting the detected signal, and a time constant circuit 8, which is controlled according to the detected signal outputted from the detecting circuit 7, for setting an attack recovery time to prevent the variation of the frequency characteristic provided by the variable filter 2 from leading to substantial impairment in auditory sound quality.

In the arrangement shown in FIG. 1, the sound collected by the microphone 1 is converted into an electrical signal (i.e., an audio signal) and is then supplied to the variable filter 2 and to the BPF 5.

Figure 4:
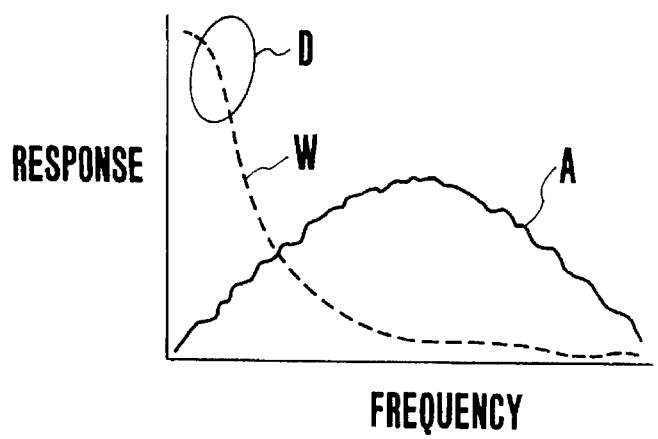
FIG. 4 is an illustration showing the frequency characteristic of a signal outputted from a microphone in the sound recording device shown in FIG. 1.

FIG. 4 is an illustration showing the frequency characteristic of the signal outputted from the microphone 1. In FIG. 4, a curve A represents the frequency characteristic of sound to be recorded and a curve W, the frequency characteristic of wind noise.

Figure 6:
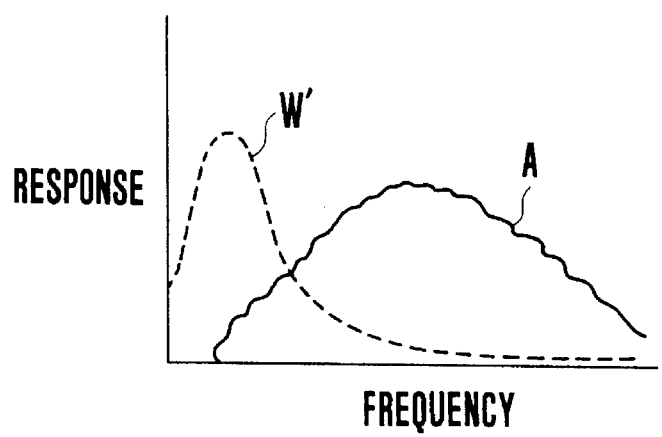
FIG. 6 is an illustration showing the frequency characteristic of a signal outputted from a sound amplifying circuit in a conventional sound recording device.

As shown in FIG. 4, except for special cases, the frequency characteristic of sound is distributed over a frequency range centered at approximately 1 kHz. To eliminate the influence of wind noise, typical sound amplifying circuits in tape recorders or the like, as shown in FIG. 6, are arranged to attenuate the signal component (indicated at W' in FIG. 6) of the wind noise by attenuating the portion of the audio signal which is 100 Hz or lower. However, since the frequency characteristic of the wind noise contains a frequency component of 100 Hz or higher, if the wind noise has the frequency band 50–200 Hz, the high-frequency component of the wind noise will remain unattenuated and the quality of the sound to be recorded will be degraded.

Figure 2:
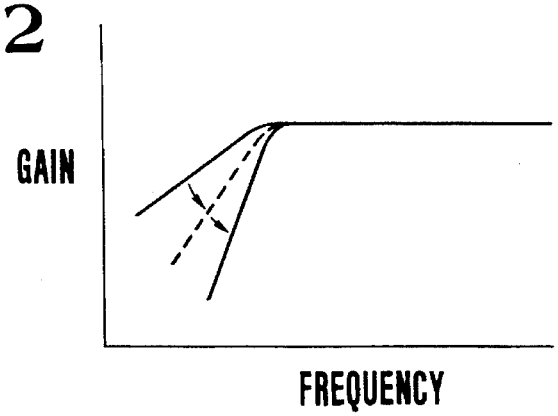
FIG. 2 is an illustration showing a frequency characteristic of a variable filter in the sound recording device shown in FIG. 1.
Figure 3:
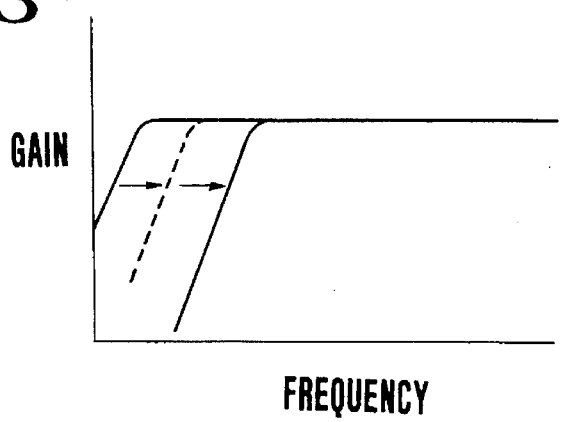
FIG. 3 is an illustration showing another frequency characteristic of the variable filter in the sound recording device shown in FIG. 1.
Figure 5:
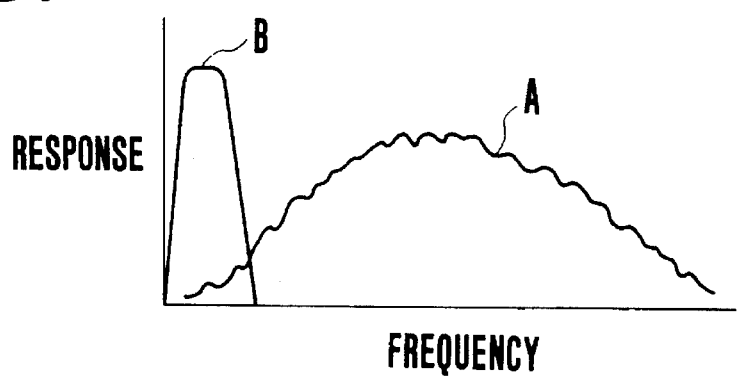
FIG. 5 is an illustration showing the frequency characteristic of a band-pass filter in the sound recording device shown in FIG. 1.

For the above-described reason, in the first embodiment, as shown in FIG. 5, a signal of frequency band shown at B (for example, 10–70 Hz) is extracted by the BPF 5 with respect to the frequency band (indicated at A in FIG. 5) of the sound to be recorded, and the signal-pass characteristic of the variable filter 2 which is being supplied with the audio signal generated from the microphone 1 is controlled according to the detected level of the extracted signal in such a manner that the amount of attenuation of the low-frequency signal is varied as shown in FIG. 2 or that the cut-off frequency of the low-frequency band is varied as shown in FIG. 3, thereby eliminating the influence of the wind noise.

The aforesaid processing operation will be described below in more detail.

The signal of frequency band shown at B in FIG. 5 is extracted by the BPF 5 of FIG. 1 from the audio signal supplied from the microphone 1, and the extracted signal is amplified by the next-stage amplifier 6 and is then supplied to the detecting circuit 7.

The detecting circuit 7 detects the signal shown at D in FIG. 4 which has been extracted by the BPF 5, and outputs the detected signal to the time constant circuit 8.

Figure 7:
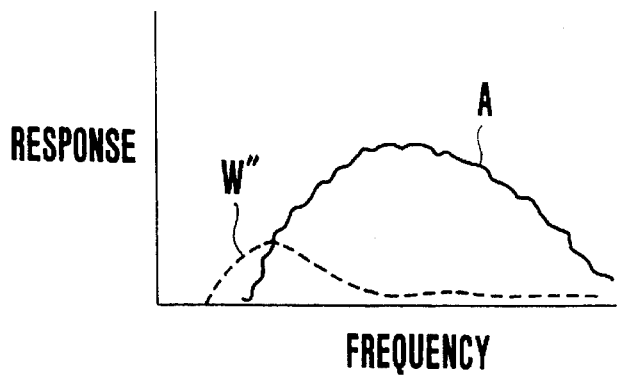
FIG. 7 is an illustration showing the frequency characteristic of a signal outputted from the variable filter in the sound recording device shown in FIG. 1.

The time constant circuit 8 integrates by a capacitor or the like the detected signal outputted from the detecting circuit 7. If the level of the integrated signal exceeds a predetermined threshold, the time constant circuit 8 causes the band-pass characteristic of the variable filter 2 to vary continuously in the direction in which the low-frequency component is attenuated, according to the level of the integrated signal, and also causes the capacitor to discharge. During the discharge of the capacitor as well, the time constant circuit 8 causes the band-pass characteristic of the variable filter 2 to vary continuously in the direction in which the low-frequency component is attenuated. Thus, substantial impairment in auditory sound quality is prevented from being caused by the variation of the frequency characteristic which is effected by the variable filter 2 for the purpose of attenuating the wind-noise signal component (W" in FIG. 7) contained in the audio signal as shown in FIG. 7.

Then, the audio signal whose wind-noise signal component has been attenuated in the variable filter 2 is amplified by the amplifier 3 and is subsequently recorded on the recording medium such as a magnetic tape in the recording part 4.

As described above, the first embodiment is arranged such that the frequency characteristic of the variable filter which attenuates the low-frequency component in the audio signal outputted from the microphone is varied according to the level of the low-frequency component of such an audio signal. Accordingly, it is possible to attenuate the wind-noise signal component contained in the audio signal, and even if, for example, AGC is applied before the audio signal is recorded on the recording medium, the level of the audio signal component to be recorded can be prevented from attenuating by the influence of the wind-noise signal component.

Figure 8:
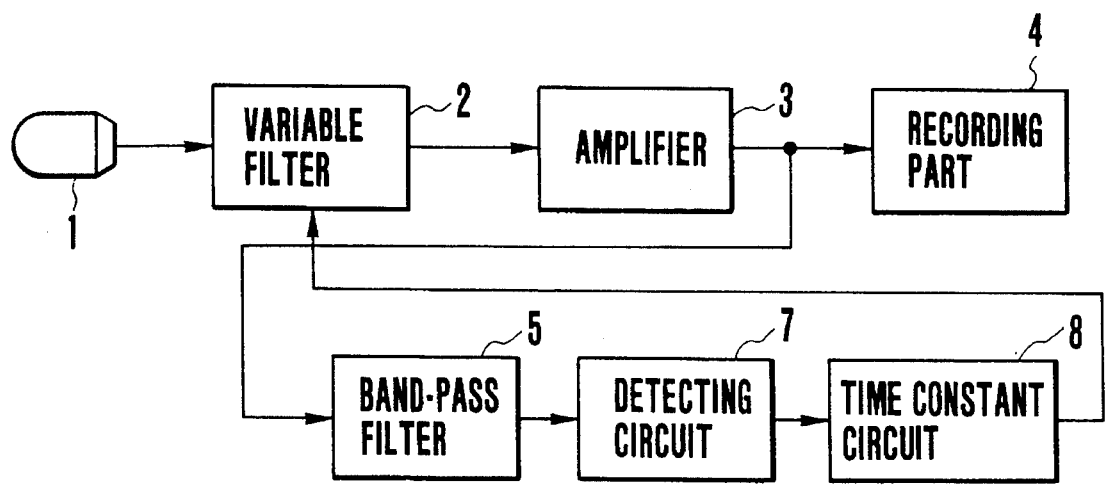
FIG. 8 is a block diagram schematically showing the arrangement and construction of a sound recording device according to a second embodiment of the present invention.

FIG. 8 is a block diagram schematically showing the arrangement and construction of a sound recording device according to a second embodiment of the present invention. In FIG. 8, the same reference numerals are used to denote elements which are similar to those of the first embodiment shown in FIG. 1, and a detailed description thereof is omitted.

As shown in FIG. 8, the low frequency of the audio signal from the microphone 1 is attenuated by the variable filter 2, and the BPF 5 extracts a low-frequency component from this audio signal. The signal-pass characteristic of the variable filter 2 is feedback-controlled according to the detected level of the extracted signal. Thus, it is possible to achieve advantages and effects which are similar to those of the first embodiment shown in FIG. 1, and it is also possible to omit the amplifier 6 of FIG. 1 or its equivalent so that the arrangement and construction can be simplified.

Figure 9:
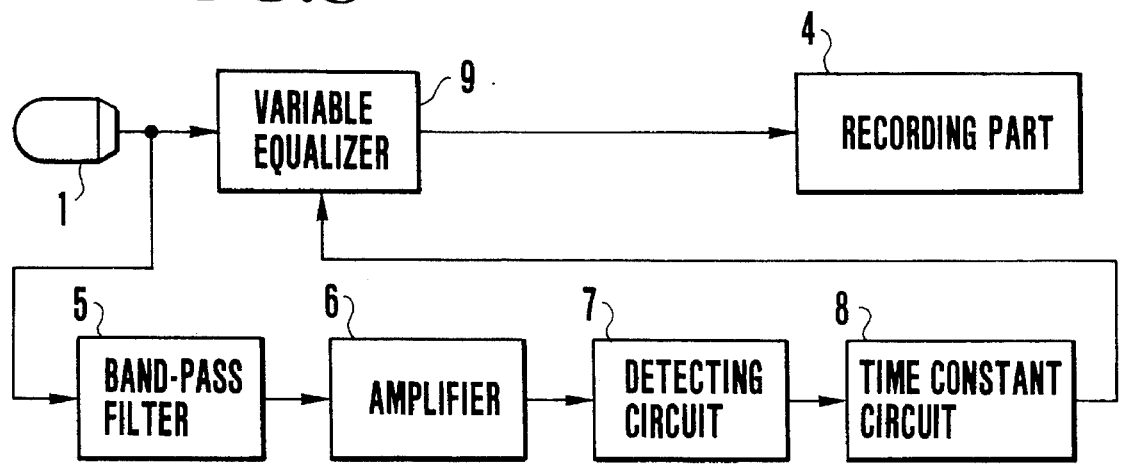
FIG. 9 is a block diagram schematically showing the arrangement and construction of a sound recording device according to a third embodiment of the present invention.

FIG. 9 is a block diagram schematically showing the arrangement and construction of the sound recording device according to a third embodiment of the present invention.

In the arrangement shown in FIG. 9, a variable equalizer 9 is provided for varying the frequency characteristic of an audio signal generated from the microphone 1. Since the other elements are similar to those of the first embodiment shown in FIG. 1, the same reference numerals are used to denote them and a detailed description thereof is omitted.

Figure 10:
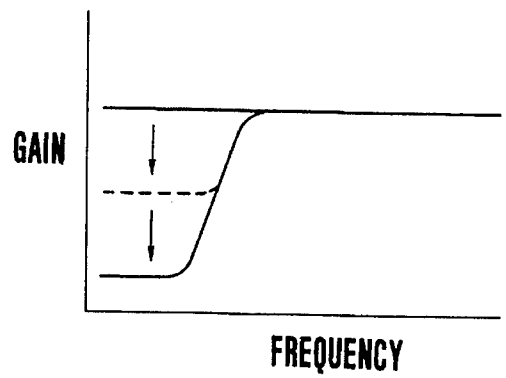
FIG. 10 is an illustration showing a frequency characteristic of a variable equalizer in the sound recording device shown in FIG. 9.
Figure 11:
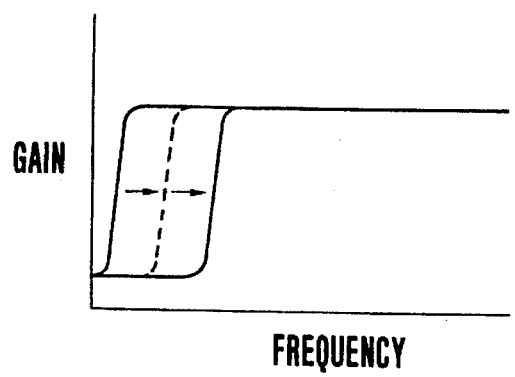
FIG. 11 is an illustration showing another frequency characteristic of the variable filter in the sound recording device shown in FIG. 9.

In the third embodiment, as shown in FIG. 5, the signal of frequency band shown at B (for example, 10–70 Hz) is extracted by the BPF 5 of FIG. 9 with respect to the frequency band (indicated at A in FIG. 5) of the sound to be recorded, and the frequency characteristic of the variable equalizer 9 which is being supplied with the audio signal generated from the microphone 1 is controlled according to the detected level of the extracted signal in such a manner that the level of the low-frequency component is varied as shown in FIG. 10 or that the cut-off frequency of the low-frequency band is varied as shown in FIG. 11, thereby eliminating the influence of the wind noise.

The aforesaid processing operation will be described below in more detail.

The signal of frequency band shown at B in FIG. 5 is extracted by the BPF 5 of FIG. 1 from the audio signal supplied from the microphone 1, and the extracted signal is amplified by the next-stage amplifier 6 and is then supplied to the detecting circuit 7.

The detecting circuit 7 detects the signal shown at D in FIG. 4 which has been extracted by the BPF 5, and outputs the detected signal to the time constant circuit 8.

The time constant circuit 8 integrates by the capacitor or the like the detected signal outputted from the detecting circuit 7. If the level of the integrated signal exceeds the predetermined threshold, the time constant circuit 8 causes the frequency characteristic of the variable equalizer 9 to vary continuously in the direction in which the level of the low-frequency component is decreased, according to the level of the integrated signal, and also causes the capacitor to discharge. During the discharge of the capacitor as well, the time constant circuit 8 causes the frequency characteristic of the variable equalizer 9 to vary continuously in the direction in which the level of the low-frequency component is decreased. Thus, substantial impairment in auditory sound quality is prevented from being caused by the variation of the frequency characteristic which is effected by the variable equalizer 9 for the purpose of decreasing the level of the wind-noise signal component (W" in FIG. 7) contained in the audio signal as shown in FIG. 7.

Then, the audio signal whose wind-noise signal component has been attenuated in the variable equalizer 9 is recorded on the recording medium such as a magnetic tape in the recording part 4.

As described above, the third embodiment is arranged such that the frequency characteristic of the variable equalizer which decreases the level of the low-frequency component in the audio signal outputted from the microphone is varied according to the level of the low-frequency component of such an audio signal. Accordingly, it is possible to attenuate the wind-noise signal component contained in the audio signal, and even if, for example, AGC is applied before the audio signal is recorded on the recording medium, the level of the audio signal component to be recorded can be prevented from attenuating by the influence of the wind-noise signal component.

Figure 12:
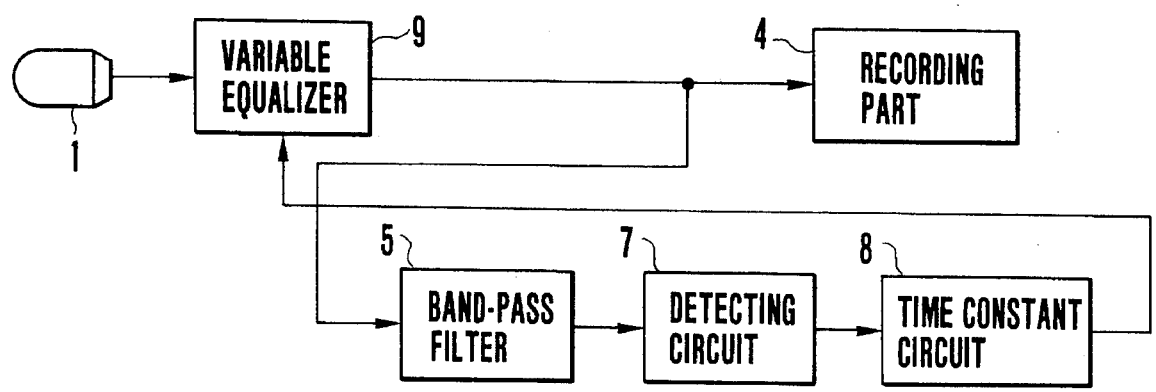
FIG. 12 is a block diagram schematically showing the arrangement and construction of a sound recording device according to a fourth embodiment of the present invention.

FIG. 12 is a block diagram schematically showing the arrangement and construction of a sound recording device according to a fourth embodiment of the present invention. In FIG. 12, the same reference numerals are used to denote elements which are similar to those of the third embodiment shown in FIG. 9, and a detailed description thereof is omitted.

As shown in FIG. 12, the low-frequency component of the audio signal from the microphone 1 is decreased in level by the variable equalizer 9, and the BPF 5 extracts the low-frequency component from this audio signal. The frequency characteristic of the variable equalizer 9 is feedback-controlled according to the detected level of the extracted signal. Thus, it is possible to achieve advantages and effects which are similar to those of the third embodiment shown in FIG. 9, and it is also possible to omit the amplifier 6 of FIG. 1 or its equivalent so that the arrangement and construction can be simplified.

As is apparent from the foregoing description, according to any of the first to fourth embodiments, it is possible to provide a sound processing device which is capable of easily processing sound without suffering the influence of wind noise or the like, without the need to increase the size of the device and by means of a simple arrangement and construction.

Figure 13:
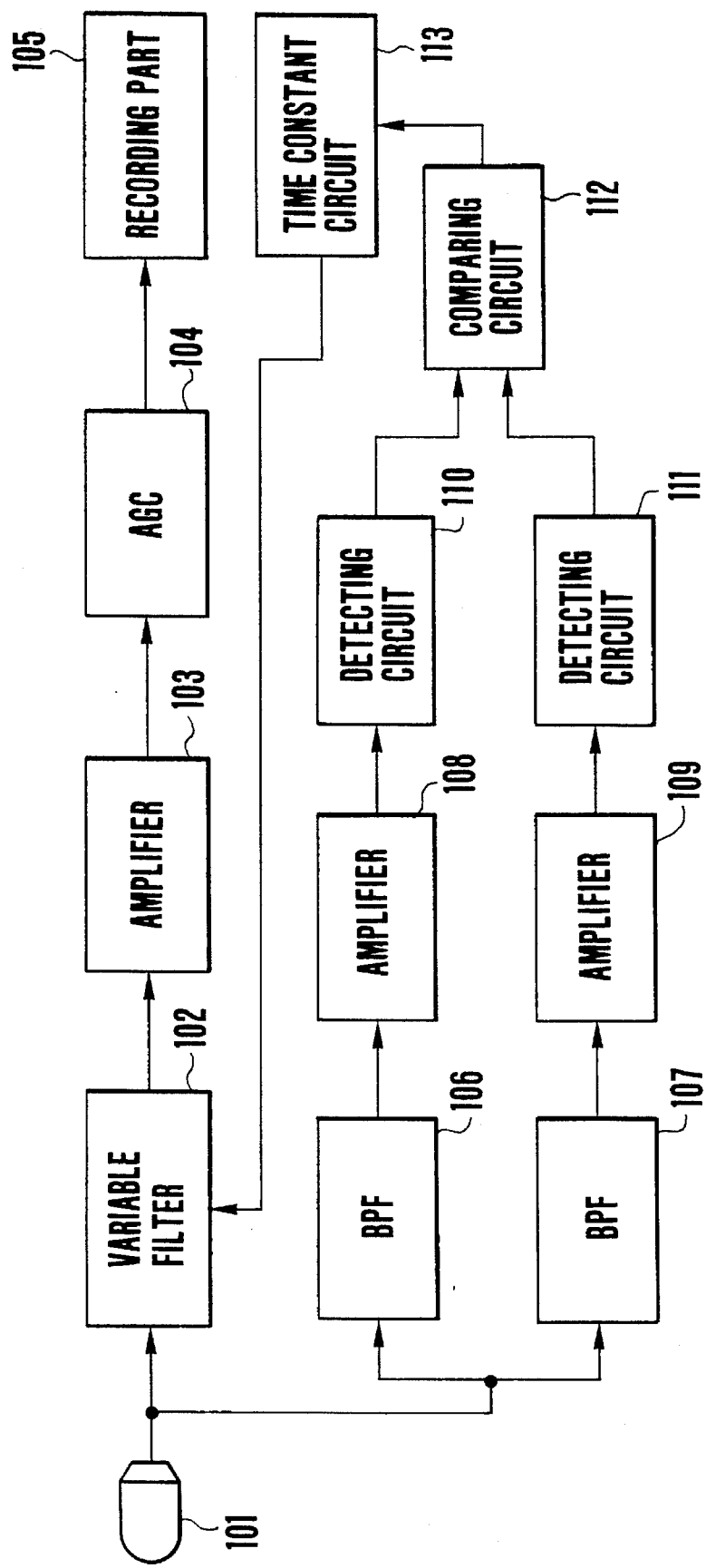
FIG. 13 is a block diagram schematically showing the arrangement and construction of a sound recording device according to a fifth embodiment of the present invention.

FIG. 13 is a block diagram schematically showing the arrangement and construction of a sound recording device according to a fifth embodiment of the present invention.

The arrangement shown in FIG. 13 includes a microphone 101 for converting sound into an electrical signal, a variable filter 102 for varying the frequency characteristic of an audio signal generated from the microphone 101, an amplifier 103 for amplifying the audio signal outputted from the variable filter 102, an AGC (Automatic Gain Controller) 104 for limiting the level of the audio signal amplified by the amplifier 103 so that the audio signal does not exceed a predetermined level, a recording part 105 for recording the audio signal level-limited by the AGC 104 on a recording medium such as a magnetic tape, a band-pass filter (BPF) 106 for separating a low-frequency component from the audio signal generated from the microphone 101, a BPF 107 for separating a middle-frequency component from the audio signal generated from the microphone 101, an amplifier 108 for amplifying the low-frequency component signal separated by the BPF 106, an amplifier 109 for amplifying the middle-component signal separated by the BPF 107, a detecting circuit 110 for detecting the low-frequency component signal of the audio signal, which has been amplified by the amplifier 108, and outputting the detected signal, a detecting circuit 111 for detecting the high-frequency component signal of the audio signal, which has been amplified by the amplifier 109, and outputting the detected signal, a comparing circuit 112 for comparing the level of the detected signal of the low-frequency component signal outputted from the detecting circuit 110 with the level of the detected signal of the middle-frequency component signal outputted from the detecting circuit 111, and outputting the comparison signal, and a time constant circuit 113, which is controlled according to the comparison signal outputted from the comparing circuit 112, for setting an attack recovery time to prevent the variation of the frequency characteristic provided by the variable filter 102 from leading to substantial impairment in auditory sound quality.

In the arrangement shown in FIG. 13, the sound collected by the microphone 101 is converted into an electrical signal (i.e., an audio signal) and is then supplied to the variable filter 102 and to both of the BPFs 106 and 107.

Figure 14:
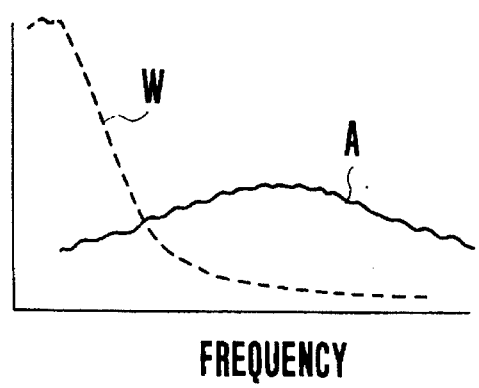
FIG. 14 is an illustration showing a frequency characteristic of a signal outputted from a microphone in the sound recording device shown in FIG. 13.
Figure 15:
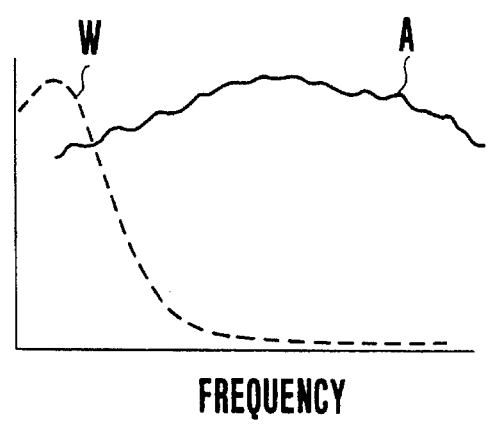
FIG. 15 is an illustration showing another frequency characteristic of a signal outputted from the microphone in the sound recording device shown in FIG. 13.

FIGS. 14 and 15 are illustrations showing the frequency characteristics of the signal outputted from the microphone 101. In each of FIGS. 14 and 15, a curve A represents the frequency characteristic of sound to be recorded and a curve W, the frequency characteristic of wind noise.

As shown in each of FIGS. 14 and 15, except for special cases, the frequency characteristic of the sound is distributed over a frequency range centered at approximately 1 kHz, while the frequency characteristic of the wind noise is distributed over a low-frequency range which is 200 Hz or lower.

If the level of the wind noise does not greatly differ from the level of the sound as shown in FIG. 15, the wind noise does not auditorily stand out with respect to the sound. However, if the level of the sound is low compared to the level of the wind noise as shown in FIG. 14, the wind noise will auditorily stand out with respect to the sound. Before recorded on the recording medium such as a magnetic tape, the audio signal is normally level-controlled by the AGC so as not to exceed a predetermined level, and if the level of the wind noise is high, the wind noise is level-limited and the level of the sound becomes relatively low. As a result, the wind noise auditorily increasingly stands out.

To eliminate the influence of such wind noise, conventional sound amplifying circuits in tape recorders or the like are typically arranged to attenuate the signal component of the wind noise by attenuating the portion of the audio signal which is 100 Hz or lower. However, since the frequency components of the wind noise are distributed up to a high frequency as shown in FIG. 14 or 15, if the portion of the audio signal which is 100 Hz or lower is attenuated, the high-frequency component of the wind noise which may have a frequency band of, for example, 50–200 Hz will remain unattenuated and the quality of the sound to be recorded will be degraded.

Figure 16:
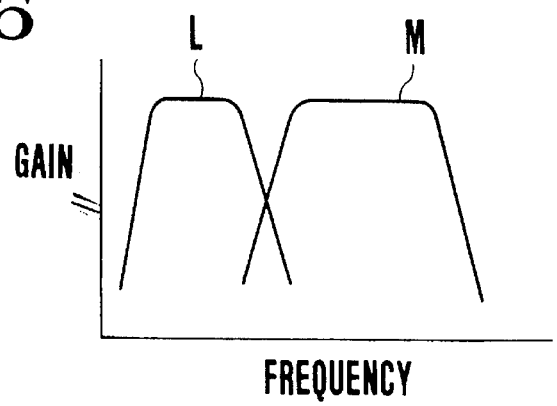
FIG. 16 is an illustration showing the frequency characteristic of a band-pass filter in the sound recording device shown in FIG. 13.
Figure 17:
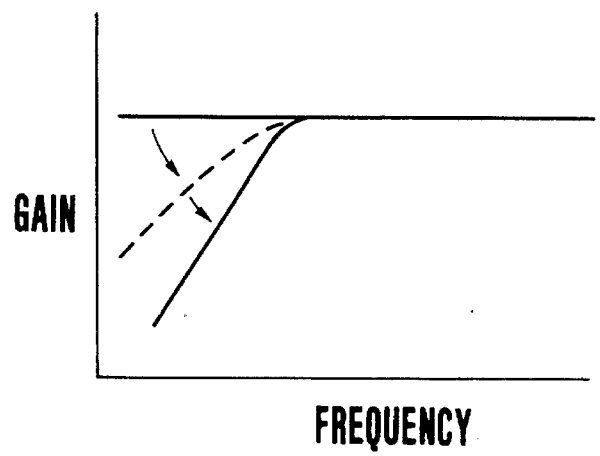
FIG. 17 is an illustration showing a frequency characteristic of a variable filter in the sound recording device of FIG. 13.
Figure 18:
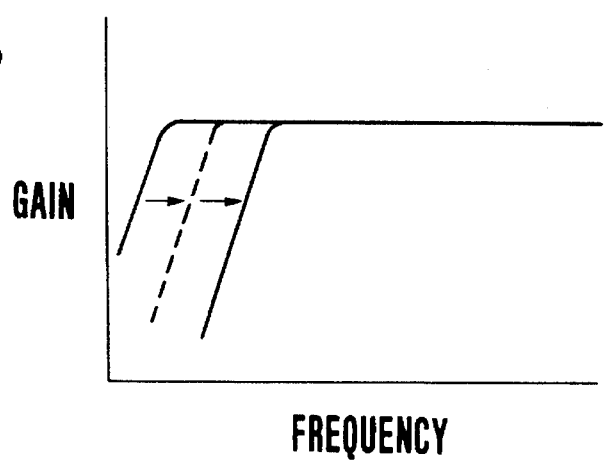
FIG. 18 is an illustration showing another frequency characteristic of the variable filter in the sound recording device of FIG. 13.

For the above-described reason, in the fifth embodiment, the BPF 106 of FIG. 13 having the low-frequency pass band shown at L in FIG. 16 and the BPF 107 of FIG. 13 having the middle-frequency pass band shown at M in FIG. 16 are used to extract a low-frequency band signal and a middle-frequency band signal from the signal generated from the microphone 101, respectively. The signal-pass characteristic of the variable filter 102 which is being supplied with the audio signal generated from the microphone 101 is controlled according to the difference between the detected levels of the respective extracted signals in such a manner that the amount of attenuation of the low-frequency signal is varied as shown in FIG. 17 or that the cut-off frequency of the low-frequency band is varied as shown in FIG. 18, thereby eliminating the influence of the wind noise.

The aforesaid processing operation will be described below in more detail.

The audio signal outputted from the microphone 101 of FIG. 13 is supplied to both of the BPFs 106 and 107.

The BPF 106 of FIG. 13 extracts the signal of low-frequency band shown at L in FIG. 16 from the audio signal supplied from the microphone 101, and the extracted signal is amplified by the next-stage amplifier 108 and is then supplied to the detecting circuit 110.

The detecting circuit 110 detects the signal of low-frequency band which has been extracted by the BPF 106, and outputs the detected signal to the comparing circuit 112.

The BPF 107 of FIG. 13 extracts the signal of middle-frequency band shown at M in FIG. 16 from the audio signal supplied from the microphone 101, and the extracted signal is amplified by the next-stage amplifier 109 and is then supplied to the detecting circuit 111.

The detecting circuit 111 detects the signal of middle-frequency band which has been extracted by the BPF 107, and outputs the detected signal to the comparing circuit 112.

The comparing circuit 112 compares the level of the detected signal of the low-frequency signal outputted from the detecting circuit 110 with the level of the detected signal of the middle-frequency signal outputted from the detecting circuit 111. On the basis of the level difference, the comparing circuit 112 outputs a comparison signal which serves to lower the gain of the variable filter 102 relative to the low-frequency band as the detected level of the low-frequency signal becomes higher than the detected level of the middle-frequency signal. The comparison signal is supplied to the time constant circuit 113.

Figure 19:
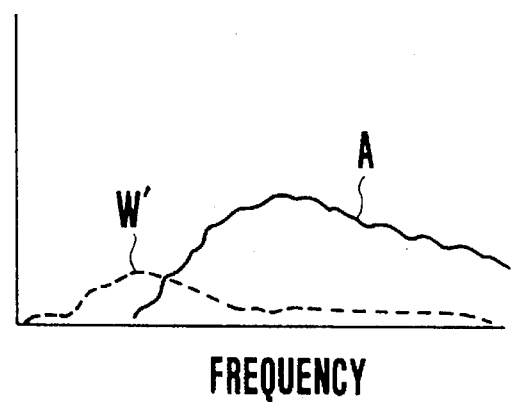
FIG. 19 is an illustration showing the frequency characteristic of a signal outputted from the variable filter in the sound recording device shown in FIG. 13.

The time constant circuit 113 integrates by a capacitor or the like the comparison signal outputted from the comparing circuit 112. If the level of the integrated signal exceeds a predetermined threshold, the time constant circuit 113 causes the band-pass characteristic of the variable filter 102 to vary continuously in the direction in which the low-frequency component is attenuated, according to the level of the integrated signal, and also causes the capacitor to discharge. During the discharge of the capacitor as well, the time constant circuit 113 causes the band-pass characteristic of the variable filter 102 to vary continuously in the direction in which the low-frequency component is attenuated. Thus, substantial impairment in auditory sound quality is prevented from being caused by the variation of the frequency characteristic which is effected by the variable filter 102 for the purpose of attenuating the wind-noise signal component (W' in FIG. 19) contained in the audio signal as shown in FIG. 19.

Then, the audio signal whose wind-noise signal component has been attenuated in the variable filter 102 is amplified by the amplifier 103, and after the amplified signal has been level-limited so as not to exceed a predetermined level by the AGC 104, the result is recorded on the recording medium such as a magnetic tape in the recording part 105.

As described above, the fifth embodiment is arranged such that the frequency characteristic of the variable filter which attenuates the low-frequency component in the audio signal outputted from the microphone is varied according to the difference between the levels of the respective low- and middle-frequency components of such an audio signal. Accordingly, it is possible to achieve appropriate attenuation control under which, if the level of the middle-frequency component is high, the low-frequency component is not attenuated, while if the level of the middle-frequency component is low, the low-frequency component is attenuated. It is, therefore, possible to prevent the wind-noise signal component contained in the audio signal from standing out auditorily. Even if the AGC is applied before the audio signal is recorded on the recording medium as shown in FIG. 13, the level of the audio signal component to be recorded can be prevented from attenuating by the influence of the wind-noise signal component.

Figure 20:
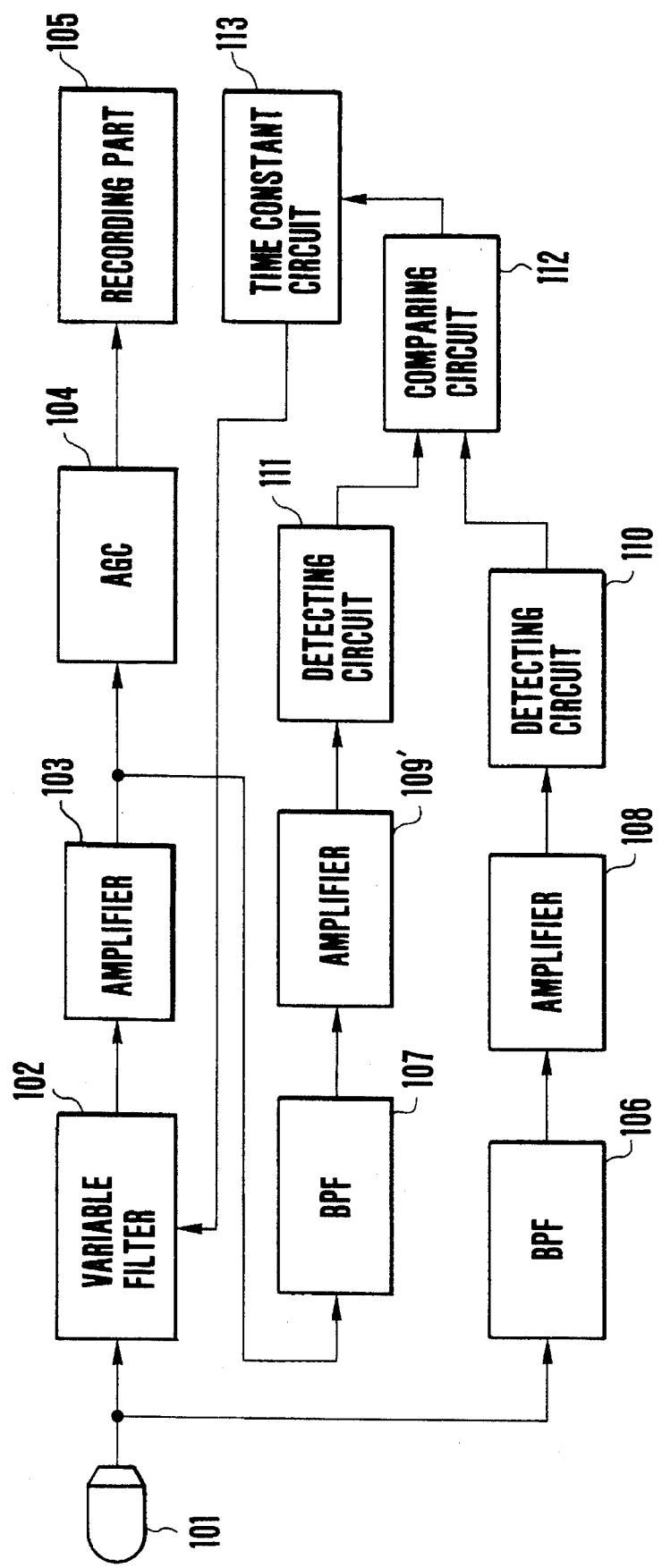
FIG. 20 is a block diagram schematically showing the arrangement and construction of a sound recording device according to a sixth embodiment of the present invention.

FIG. 20 is a block diagram schematically showing the arrangement and construction of a sound recording device according to a sixth embodiment of the present invention. In FIG. 20, the same reference numerals are used to denote elements which are similar to those of the fifth embodiment shown in FIG. 13, and a detailed description thereof is omitted.

As shown in FIG. 20, the middle-frequency component in the audio signal which is not varied in frequency characteristic by the variable filter 102 is extracted by the BPF 107 from the audio signal amplified by the amplifier 103. Accordingly, an amplifier 109' connected to the output side of the BPF 107 does not need a large amplification ratio, and the amplification ratio of the amplifier 109' can be made smaller than that of the amplifier 109 shown in FIG. 13. Thus, it is possible to achieve advantages and effects which are similar to those of the fifth embodiment shown in FIG. 13 and it is also possible to simplify the arrangement and construction.

As described above, either of the fifth and sixth embodiments is arranged such that the low-frequency component signal and the middle-frequency component signal in the audio signal outputted from the microphone are extracted and the characteristic of the variable filter which attenuates the low-frequency component in this audio signal is varied according to the difference between the levels of the low- and middle-frequency components. The characteristic of the variable filter may be controlled on the basis of the difference between the detected level of the low-frequency component signal and that of the middle-to-high-frequency component signal or on the basis of the result of a comparison between the detected levels of the respective low-, middle- and high-frequency component signals. With this arrangement as well, it is possible to achieve advantages and effects similar to those of either of the fifth and sixth embodiments.

Figure 21:
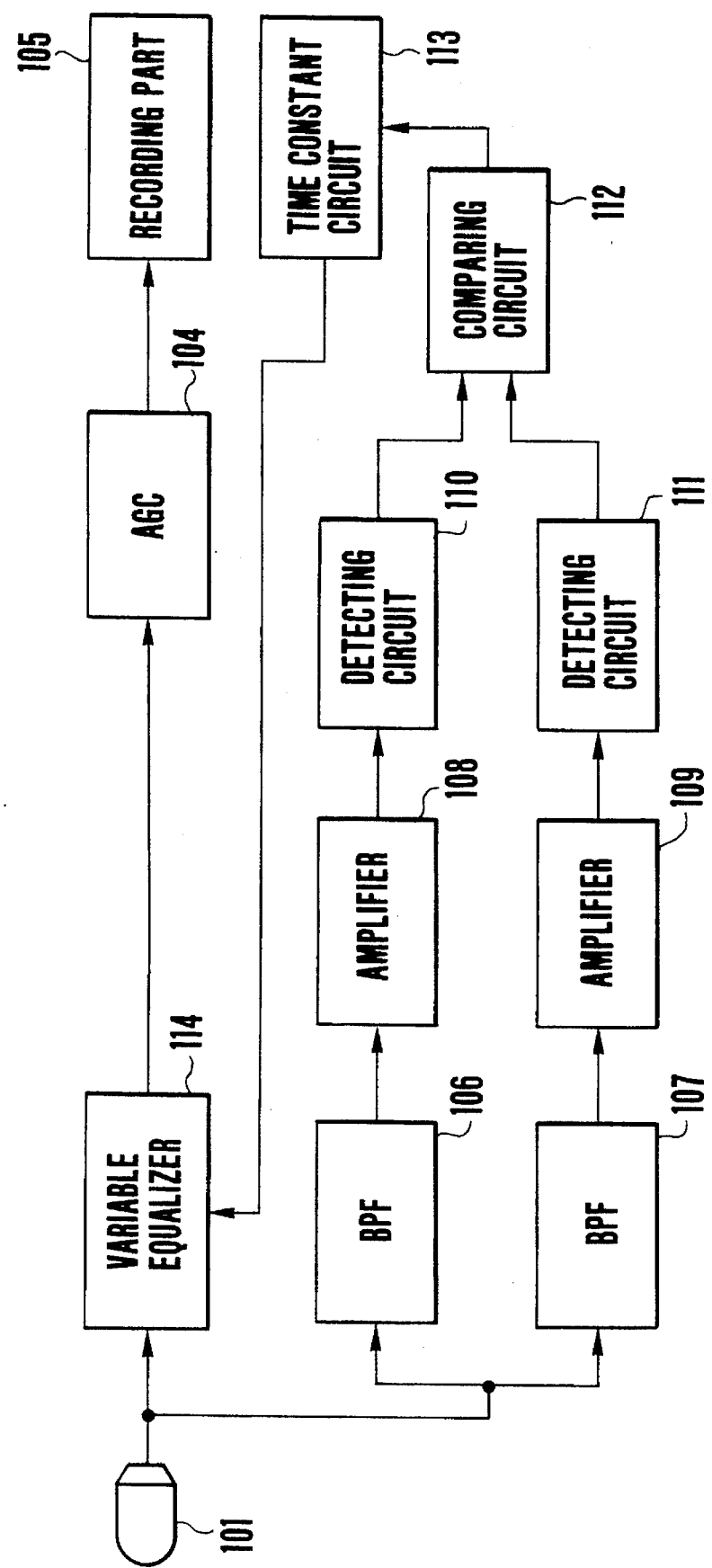
FIG. 21 is a block diagram schematically showing the arrangement and construction of a sound recording device according to a seventh embodiment of the present invention.

FIG. 21 is a block diagram schematically showing the arrangement and construction of a sound recording device according to a seventh embodiment of the present invention.

In the arrangement shown in FIG. 21, a variable equalizer 114 is provided for varying the frequency characteristic of an audio signal generated from the microphone 101. Since the other elements are similar to those of the fifth embodiment shown in FIG. 13, the same reference numerals are used to denote them and a detailed description thereof is omitted.

In the seventh embodiment, the BPF 106 of FIG. 21 having the low-frequency pass band shown at L in FIG. 16 and the BPF 107 of FIG. 21 having the middle-frequency pass band shown at M in FIG. 16 are used to extract a low-frequency band signal and a middle-frequency band signal from the signal generated from the microphone 101, respectively. The frequency characteristic of the variable equalizer 114 which is being supplied with the audio signal generated from the microphone 101 is controlled according to the difference between the detected levels of the respective extracted signals, for example, in such a manner that the level of the low-frequency component is varied as shown in FIG. 10 referenced previously or that the cut-off frequency of low-frequency band is varied as shown in FIG. 11 referenced previously, thereby eliminating the influence of the wind noise.

The aforesaid processing operation will be described below in more detail.

The audio signal outputted from the microphone 101 of FIG. 21 is supplied to both of the BPFs 106 and 107.

The BPF 106 of FIG. 21 extracts the signal of low-frequency band shown at L in FIG. 16 from the audio signal supplied from the microphone 101, and the extracted signal is amplified by the next-stage amplifier 108 and is then supplied to the detecting circuit 110.

The detecting circuit 110 detects the signal of low-frequency band which has been extracted by the BPF 106, and outputs the detected signal to the comparing circuit 112.

The BPF 107 of FIG. 21 extracts the signal of middle-frequency band shown at M in FIG. 16 from the audio signal supplied from the microphone 101, and the extracted signal is amplified by the next-stage amplifier 109 and is then supplied to the detecting circuit 111.

The detecting circuit 111 detects the signal of middle-frequency band which has been extracted by the BPF 107, and outputs the detected signal to the comparing circuit 112.

The comparing circuit 112 compares the level of the detected signal of the low-frequency signal outputted from the detecting circuit 110 with the level of the detected signal of the middle-frequency signal outputted from the detecting circuit 111. On the basis of the level difference, the comparing circuit 112 outputs a comparison signal which serves to vary the frequency characteristic of the variable equalizer 114 so as to decrease the level of the low-frequency component as the detected level of the low-frequency signal becomes higher than the detected level of the middle-frequency signal. The comparison signal is supplied to the time constant circuit 113.

The time constant circuit 113 integrates by the capacitor or the like the comparison signal outputted from the comparing circuit 112. If the level of the integrated signal exceeds a predetermined threshold, the time constant circuit 113 causes the frequency characteristic of the variable equalizer 114 to vary continuously in the direction in which the level of the low-frequency component is decreased, according to the level of the integrated signal, and also causes the capacitor to discharge. During the discharge of the capacitor as well, the time constant circuit 113 causes the frequency characteristic of the variable equalizer 114 to vary continuously in the direction in which the level of the low-frequency component is decreased. Thus, substantial impairment in auditory sound quality is prevented from being caused by the variation of the frequency characteristic which is effected by the variable equalizer 114 for the purpose of attenuating the wind-noise signal component (W' in FIG. 19) contained in the audio signal as shown in FIG. 19.

Then, the audio signal whose wind-noise signal component has been attenuated in the variable equalizer 114 is level-limited by the AGC 104 so as not to exceed a predetermined level, and the result is recorded on the recording medium such as a magnetic tape in the recording part 105.

As described above, the seventh embodiment is arranged such that the frequency characteristic of the variable equalizer 114 which decreases the level of the low-frequency component in the audio signal outputted from the microphone is varied according to the difference between the levels of the low- and middle-frequency components of such an audio signal. Accordingly, it is possible to achieve appropriate attenuation control under which, if the level of the middle-frequency component is high, the level of the low-frequency component is not decreased, while if the level of the middle-frequency component is low, the level of the low-frequency component is decreased. It is, therefore, possible to prevent the wind-noise signal component contained in the audio signal from standing out auditorily. Even if the AGC is applied before the audio signal is recorded on the recording medium as shown in FIG. 21, the level of the audio signal component to be recorded can be prevented from attenuating in level by the influence of the wind-noise signal component.

Figure 22:
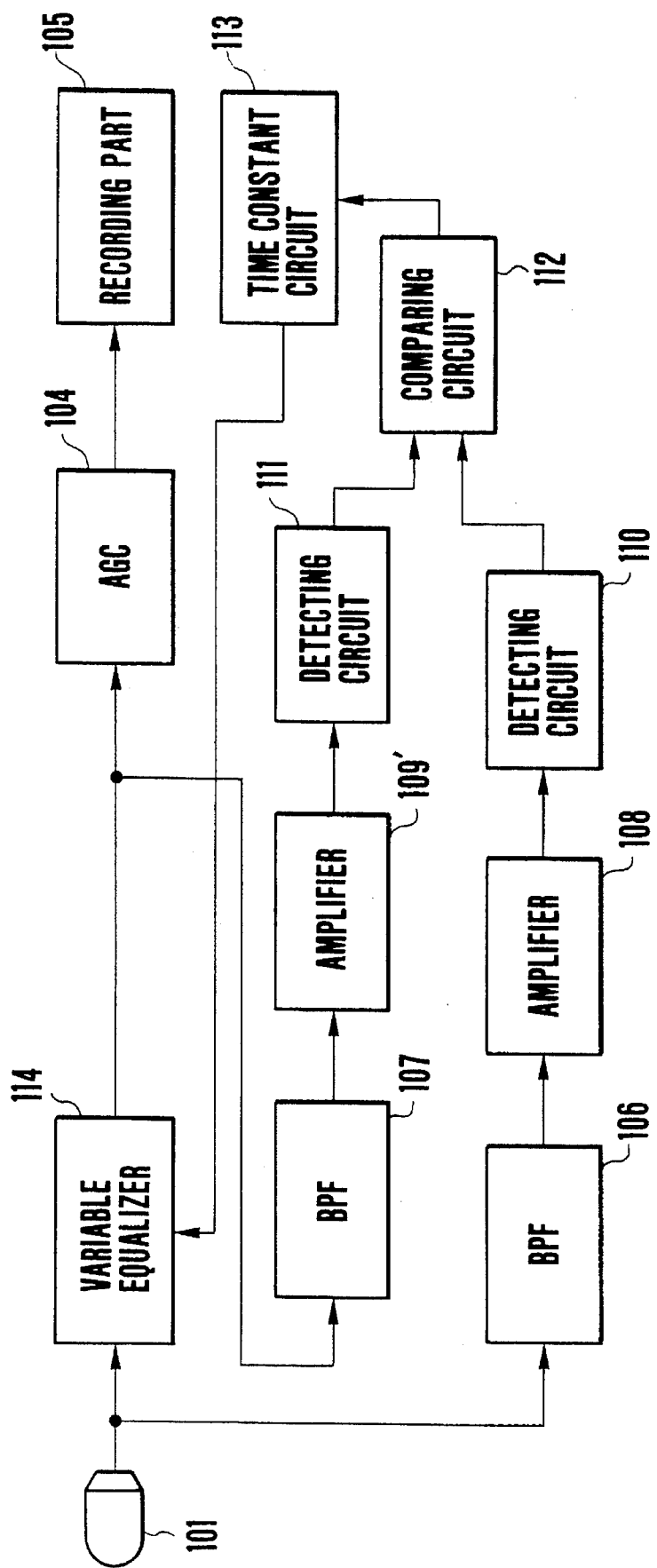
FIG. 22 is a block diagram schematically showing the arrangement and construction of a sound recording device according to an eighth embodiment of the present invention.

FIG. 22 is a block diagram schematically showing the arrangement and construction of a sound recording device according to an eighth embodiment of the present invention. In FIG. 22, the same reference numerals are used to denote elements which are similar to those of the seventh embodiment shown in FIG. 21, and a detailed description thereof is omitted.

As shown in FIG. 22, the middle-frequency component in the audio signal which is not varied in frequency characteristic by the variable equalizer 114 is extracted by the BPF 107. Accordingly, the amplifier 109' connected to the output side of the BPF 107 does not need a large amplification ratio, and the amplification ratio of the amplifier 109' can be made smaller than that of the amplifier 109 shown in FIG. 21. With the above-described arrangement and construction, it is possible to achieve advantages and effects which are similar to those of the seventh embodiment shown in FIG. 21 and it is also possible to simplify the arrangement and construction.

As described above, either of the seventh and eighth embodiments is arranged such that the low-frequency component signal and the middle-frequency component signal in the audio signal outputted from the microphone are extracted and the frequency characteristic of the variable equalizer which varies the low-frequency characteristic of this audio signal is controlled according to the difference between the detected levels of the low- and middle-frequency component signals. The frequency characteristic of the variable equalizer may be controlled on the basis of the difference between the detected level of the low-frequency component signal and that of the middle-to-high-frequency component signal or on the basis of the result of a comparison between the detected levels of the respective low-, middle- and high-frequency component signals. With this arrangement as well, it is possible to achieve advantages and effects similar to those of either of the seventh and eighth embodiments.

As is apparent from the foregoing description, according to any of the fifth to eighth embodiments, it is possible to provide a sound processing device which is capable of easily processing sound without suffering the influence of wind noise or the like, without the need to increase the size of the device and by means of a simple arrangement and construction.

Figure 23:
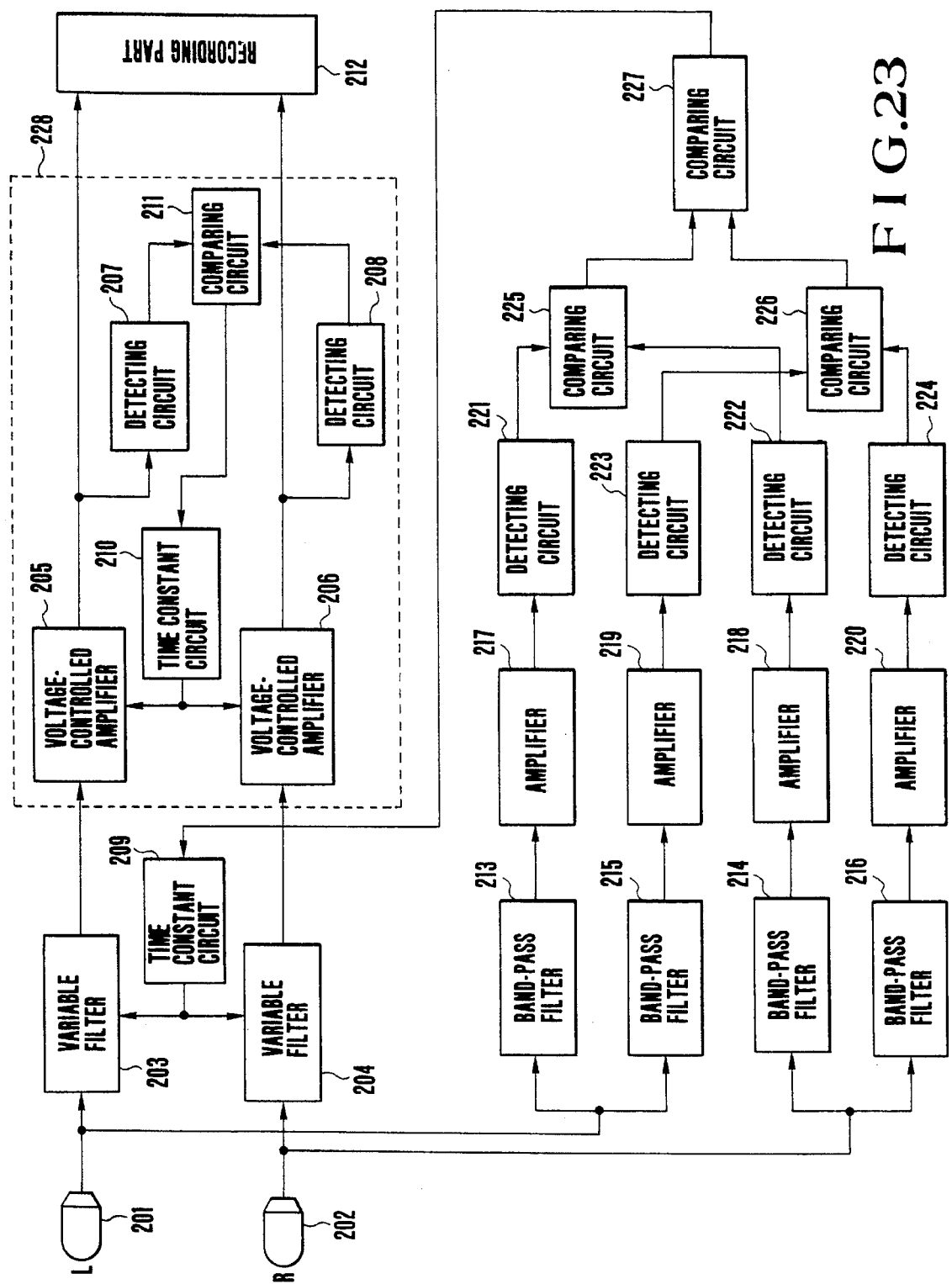
FIG. 23 is a block diagram schematically showing the arrangement and construction of a sound recording device according to a ninth embodiment of the present invention.

FIG. 23 is a block diagram schematically showing the arrangement and construction of a sound recording device according to a ninth embodiment of the present invention.

The arrangement shown in FIG. 23 includes microphones 201 and 202 for converting sound into electrical signals, respectively, and the microphone 201 serves as a left-side microphone and the microphone 202 as a right-side microphone. The arrangement also includes variable filters 203 and 204 for varying the frequency characteristics of audio signals generated from the respective microphones 201 and 202, an AGC (Automatic Gain Control) circuit 228 for amplifying the audio signals outputted from the respective variable filters 203 and 204, the AGC circuit 228 being made up of voltage-controlled amplifiers 205 and 206, detecting circuits 207 and 208, a time constant circuit 210 and a comparing circuit 211, a recording part 212 for recording the audio signal amplified by the AGC 228 on a recording medium such as a magnetic tape, band-pass filters (BPFs) 213 and 214 for separating low-frequency components from the audio signals generated from the respective microphones 201 and 202, amplifiers 217 and 218 for amplifying the signals separated by the respective BPFs 213 and 214, detecting circuits 221 and 222 for detecting the low-frequency component signals of the audio signals which have been amplified by the respective amplifiers 217 and 218, and outputting the low-frequency detected signals, BPFs 215 and 216 for separating middle-frequency components from the audio signals generated from the respective microphones 201 and amplifiers 219 and 220 for amplifying the signals separated by the respective BPFs 215 and 216, detecting circuits 223 and 224 for detecting the middle-frequency component signals of the audio signals which have been amplified by the respective amplifiers 219 and 220, and outputting the middle-frequency signals, a comparing circuit 225 for comparing the level of the low-frequency detected signal outputted from the detecting circuit 221 with the level of the low-frequency detected signal outputted from the detecting circuit 222, and outputting the low-frequency detected signal having the higher level, a comparing circuit 226 for comparing the level of the middle-frequency detected signal outputted from the detecting circuit 223 with the level of the middle-frequency detected signal outputted from the detecting circuit 224, and outputting the middle-frequency detected signal having the higher level, a comparing circuit 227 for comparing the level of the low-frequency detected signal outputted from the detecting circuit 225 with the level of the middle-frequency detected signal outputted from the detecting circuit 226, and outputting a comparison signal obtained by subtracting the level of the middle-frequency detected signal from the level of the low-frequency detected signal, and a time constant circuit 209, which is controlled according to the comparison signal outputted from the comparing circuit 227, for setting an attack recovery time to prevent the variation of the frequency characteristic provided by each of the variable filters 203 and 204 from leading to substantial impairment in auditory sound quality.

In the arrangement shown in FIG. 23, the sounds collected by the respective microphones 201 and 202 are converted into electrical signals (i.e., audio signals). The electrical signal from the microphone 201 is supplied to the variable filter 203 and to the BPFs 213 and 215, while the electrical signal from the microphone 202 is supplied to the variable filter 204 and to the BPFs 214 and 216.

As shown in each of FIGS. 14 and 15 referenced previously, except for special cases, the frequency characteristic of the signal outputted from each of the microphones 201 and 202 shows a distribution in which the frequency characteristic of the sound is distributed over a frequency range centered at approximately 1 kHz and the frequency characteristic of the wind noise is distributed over a low-frequency range which is 200 Hz or lower.

If the level of the wind noise does not greatly differ from the level of the sound as shown in FIG. 15 referenced previously, the wind noise does not auditorily stand out with respect to the sound. However, if the level of the sound is low compared to the level of the wind noise as shown in FIG. 14 referenced previously, the wind noise will auditorily stand out with respect to the sound. Before recorded on the recording medium such as a magnetic tape, the audio signal is normally level-controlled by the AGC circuit 228 of FIG. 23 so as not to exceed a predetermined level, and if the level of the wind noise is high, the wind noise is level-limited and the level of the sound becomes relatively low. As a result, the wind noise auditorily increasingly stands out.

To eliminate the influence of such wind noise, conventional sound amplifying circuits in tape recorders or the like are typically arranged to attenuate the signal component of the wind noise by attenuating the portion of the audio signal which is 100 Hz or lower. However, since the frequency components of the wind noise are distributed up to a high frequency as shown in FIG. 14 or 15, if the portion of the audio signal which is 100 Hz or lower is attenuated, the high-frequency component of the wind noise which may have a frequency band of, for example, 50–200 Hz will remain unattenuated and the quality of the sound to be recorded will be degraded.

For the above-described reason, in the ninth embodiment, the BPF 213 of FIG. 23 having the low-frequency pass band shown at L in FIG. 16 referenced previously and the BPF 215 of FIG. 23 having the middle-frequency pass band shown at M in FIG. 16 are used to extract a low-frequency band signal and a middle-frequency band signal from the signal generated from the microphone 201, respectively. In the meantime, the BPF 214 of FIG. 23 having the low-frequency pass band shown at L in FIG. 16 referenced previously and the BPF 216 of FIG. 23 having the middle-frequency pass band shown at M in FIG. 16 are used to extract a low-frequency band signal and a middle-frequency band signal from the signal generated from the microphone 202, respectively. The signal-pass characteristics of the respective variable filters 203 and 204 which are being supplied with the audio signals generated from the two respective microphones 201 and 202 are controlled according to the difference between the low-frequency detected signal whose detected level is the higher of those of the low-frequency band signals extracted from the audio signals outputted from the two respective microphones 201 and 202 and the middle-frequency detected signal whose detected level is the higher of those of the middle-frequency band signals extracted from the audio signals outputted from the two respective microphones 201 and 202, whereby the amounts of attenuation of the respective low-frequency signals are varied as shown in FIG. 17 referenced previously or that the cut-off frequencies of the respective low-frequency bands are varied as shown in FIG. 18 referenced previously, thereby eliminating the influence of the wind noise.

The aforesaid processing operation will be described below in more detail.

The audio signals outputted from the microphones 201 and 202 of FIG. 23 are supplied to the BPFs 213 and 215 and the BPFs 214 and 216, respectively.

The BPFs 213 and 214 of FIG. 23 extract signals each of low-frequency band shown at L in FIG. 16 from the audio signals supplied from the microphones 201 and 202, respectively. The extracted signals are respectively amplified by the next-stage amplifiers 217 and 218 and are then supplied to the associated detecting circuits 221 and 222.

The detecting circuits 221 and 222 respectively detect the signals of low-frequency bands which have been extracted by the BPFs 213 and 214, and output the low-frequency detected signals to the comparing circuit 225.

The comparing circuit 225 compares the levels of the low-frequency detected signals supplied from the respective detecting circuits 221 and 222, and supplies the low-frequency detected signal of the higher level to the next-stage comparing circuit 227.

The BPFs 215 and 216 of FIG. 23 extract signals each of middle-frequency band shown at M in FIG. 16 from the audio signals supplied from the microphones 201 and 202, respectively. The extracted signals are respectively amplified by the next-stage amplifiers 219 and 220 and are then supplied to the associated detecting circuits 223 and 224.

The detecting circuits 223 and 224 respectively detect the signals of middle-frequency bands which have been extracted by the BPFs 215 and 216, and output the middle-frequency detected signals to the comparing circuit 226.

The comparing circuit 226 compares the levels of the middle-frequency detected signals supplied from the respective detecting circuits 223 and 224, and supplies the middle-frequency detected signal of the higher level to the next-stage comparing circuit 227.

The comparing circuit 227 compares the level of the low-frequency detected signal outputted from the comparing circuit 225 with the level of the middle-frequency detected signal outputted from the comparing circuit 226. On the basis of the level difference, the comparing circuit 227 outputs a comparison signal which serves to lower the gain of each of the variable filters 203 and 204 relative to the low-frequency band as the detected level of the low-frequency signal becomes higher than the detected level of the middle-frequency signal. The comparison signal is supplied to the time constant circuit 209.

The time constant circuit 209 integrates by a capacitor or the like the comparison signal outputted from the comparing circuit 227. If the level of the integrated signal exceeds a predetermined threshold, the time constant circuit 209 causes the band-pass characteristic of each of the variable filters 203 and 204 to vary continuously in the direction in which the low-frequency component is attenuated, according to the level of the integrated signal, and also causes the capacitor to discharge. During the discharge of the capacitor as well, the time constant circuit 209 causes the band-pass characteristic of each of the variable filters 203 and 204 to vary continuously in the direction in which the low-frequency component is attenuated. Thus, substantial impairment in auditory sound quality is prevented from being caused by the variation of the frequency characteristic which is effected by each of the variable filters 203 and 204 for the purpose of attenuating the wind-noise signal components (W' in FIG. 19) contained in the respective audio signals as shown in FIG. 19.

Then, the audio signals whose wind-noise signal components have been attenuated in the respective variable filters 203 and 204 are level-limited by the AGC circuit 228 so as not to exceed predetermined levels, and the resultant signals are recorded on the recording medium such as a magnetic tape in the recording part 212.

The AGC circuit 228, as shown in FIG. 23, is made up of the voltage-controlled amplifiers 205 and 206, the detecting circuits 207 and 208, the comparing circuit 211 and the time constant circuit 210. The audio signals supplied from the variable filters 203 and 204 are respectively amplified by the voltage-controlled amplifiers 205 and 206 and are then supplied to the recording part 212. The audio signals outputted from the voltage-controlled amplifiers 205 and 206 are also supplied to the associated detecting circuits 207 and 208. The detected signals formed by detection in the respective detecting circuits 207 and 208 are supplied to the comparing circuit 211.

The comparing circuit 211 compares the levels of the detected signals supplied from the respective detecting circuits 207 and 208, and supplies the detected signal of the higher level to the voltage-controlled amplifiers 205 and 206 via the time constant circuit 210 as control signals for the voltage-controlled amplifiers 205 and 206.

If the levels of the supplied detected signals exceed corresponding predetermined levels, the voltage-controlled amplifiers 205 and 206 lower their respective gains relative to the input audio signals. Thus, the amplified signals which have been level-limited so as not to exceed the respective predetermined levels are outputted from the respective voltage-controlled amplifiers 205 and 206 to the recording part 212.

The time constant circuit 210 supplies the detected signal outputted from the comparing circuit 211 to the voltage-controlled amplifiers 205 and 206 with a predetermined time constant so that the levels of the audio signals can be limited by the voltage-controlled amplifiers 205 and 206 so as not to cause substantial impairment in auditory sound quality.

As described above, the ninth embodiment is arranged such that the frequency characteristics of the respective variable filters which attenuate the low-frequency components in the audio signals outputted from the microphones are varied according to the difference between the levels of the low- and middle-frequency components of such audio signals. Accordingly, it is possible to achieve appropriate attenuation control under which, if the level of the middle-frequency component is high, the low-frequency component is not attenuated, while if the level of the middle-frequency component is low, the low-frequency component is attenuated. It is, therefore, possible to prevent the wind-noise signal components contained in the audio signals from standing out auditorily. Even if the AGC is applied before the audio signals are recorded on the recording medium as shown in FIG. 23, the levels of the audio signal components to be recorded can be prevented from attenuating by the influence of the wind-noise signal components.

In addition, in the ninth embodiment, the low-frequency band-pass characteristics of the variable filters 203 and 204 for controlling the levels of the low-frequency components in the audio signals generated from the respective microphones 201 and 202 are both controlled by the comparison signal generated from the comparing circuit 227. Accordingly, it is possible to keep the balance of frequency characteristics between the audio signals generated from the respective microphones 201 and 202 which are employed as a stereophonic microphone system.

Figure 24:
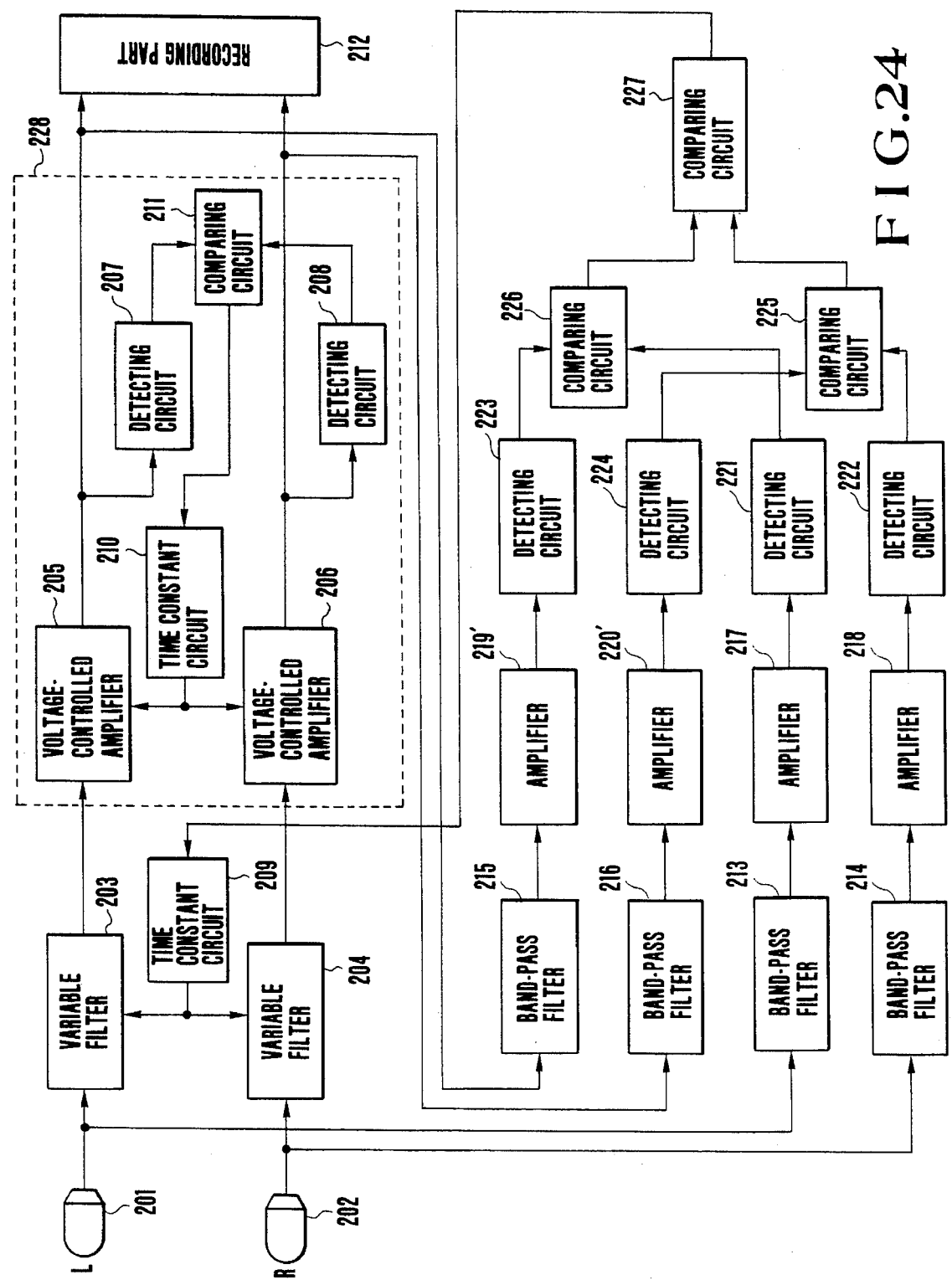
FIG. 24 is a block diagram schematically showing the arrangement and construction of a sound recording device according to a tenth embodiment of the present invention.

FIG. 24 is a block diagram schematically showing the arrangement and construction of a sound recording device according to a tenth embodiment of the present invention. In FIG. 24, the same reference numerals are used to denote elements which are similar to those of the ninth embodiment shown in FIG. 23, and a detailed description thereof is omitted.

The embodiment shown in FIG. 23 is arranged such that a low-frequency component signal and a middle-frequency component signal are extracted from each of audio signals which are generated from the respective microphones 201 and 202, before they are supplied to the variable filters 203 and 204. However, in the above-described arrangement, it is necessary to increase the amplification factors of the respective amplifiers 219 and 220 which amplify the extracted middle-frequency component signals. To realize such an increase in amplification factor the cost increase, since a large number of parts are needed.

As shown in FIG. 24, the middle-frequency component signals in the audio signals which are not varied in frequency characteristic by the respective variable filters 203 and 204 are extracted by the BPFs 215 and 216 from the audio signals which have been amplified in the AGC circuit 228 so as not to exceed the respective predetermined levels. Accordingly, there is no need to increase the amplification factor of either of amplifiers 219' and 220' connected to the output sides of the BPFs 215 and 216, and the amplification factors of the amplifiers 219' and 220' can be made smaller than those of the amplifiers 219 and 220 shown in FIG. 23. With the above-described arrangement and construction, it is possible to achieve advantages and effects which are similar to those of the ninth embodiment shown in FIG. 23 and it is also possible to reduce the number of parts and simplify the arrangement and construction, thereby enabling a reduction in cost.

Figure 25:
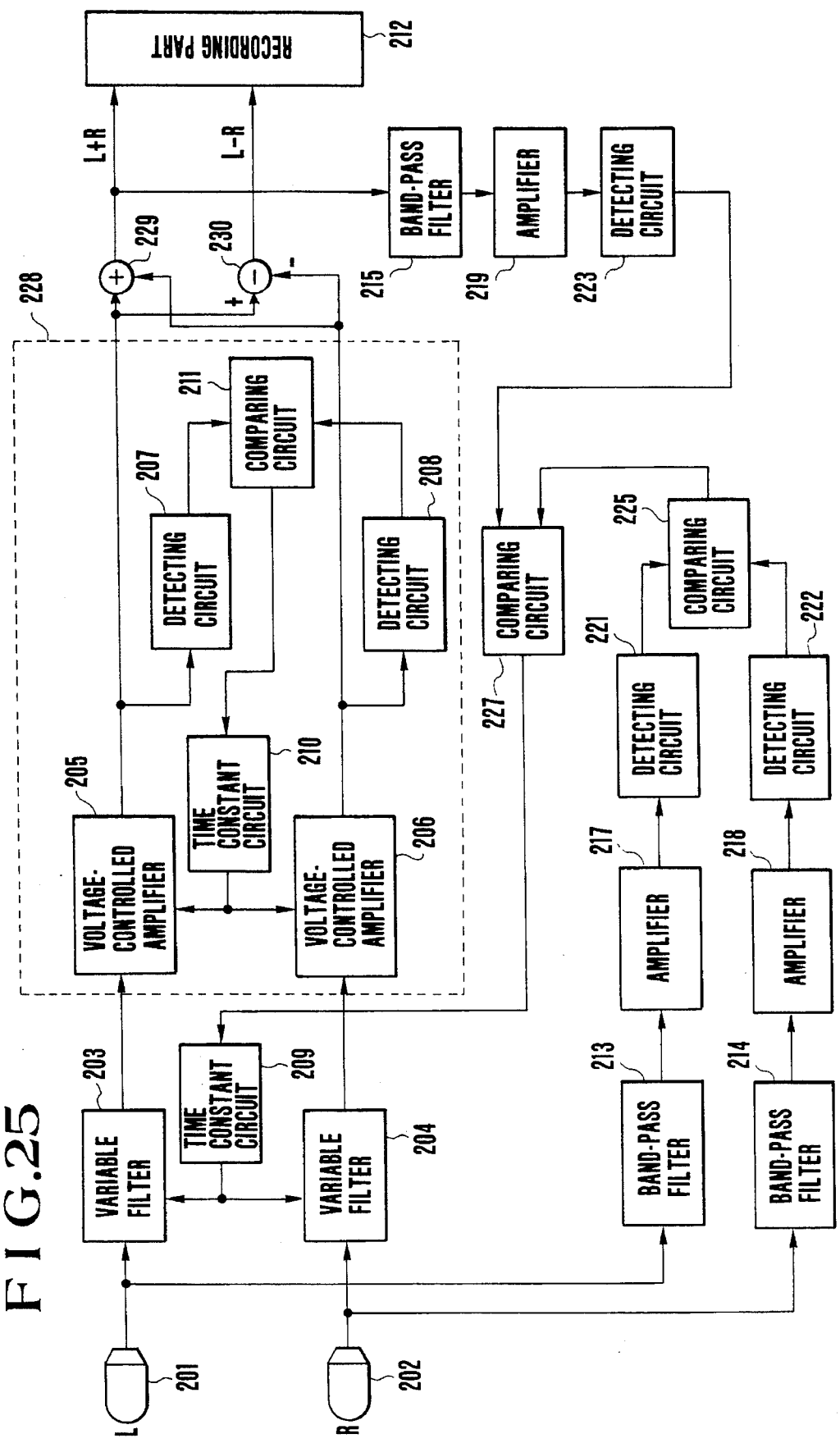
FIG. 25 is a block diagram schematically showing the arrangement and construction of a sound recording device according to an eleventh embodiment of the present invention.

The tenth embodiment shown in FIG. 24 is arranged such that the middle-frequency component signals are respectively extracted by the BPFs 215 and 216 from the audio signals generated from the microphone 201 and the microphone 202. In the eleventh embodiment shown in FIG. 25, the left-side audio signal generated from the microphone 201 and the right-side audio signal generated from the microphone 202 are added together by an adder 229 to form a sum signal, while the left-side audio signal and the right-side audio signal are subtracted from each other by a subtracter 230 to form a difference signal. The thus-converted signals are recorded on a recording medium. In such a sound recording device, the middle-frequency component signal is extracted from the sum signal outputted from the adder 229 by the BPF 215, and the extracted signal is amplified by the amplifier 219 and is then detected by the detecting circuit 223. The detected signal is supplied to the comparing circuit 227. Thus, it is possible to achieve advantages and effects which are similar to those of the tenth embodiment shown in FIG. 24, and since the BPF 216, the amplifier 220', the detecting circuit 224 and the comparing circuit 226 which are shown in FIG. 24 can be omitted, it is possible to simplify the arrangement and construction and realize a reduction in cost.

As described above, any of the ninth to eleventh embodiments is arranged such that the low-frequency component signal and the middle-frequency component signal in each of the audio signals outputted from the microphones are extracted and the characteristics of the variable filters which attenuate the low-frequency components in the respective audio signals are varied according to the difference between the levels of the low- and middle-frequency components. The characteristics of the respective variable filters may be controlled on the basis of the difference between the detected level of the low-frequency component signal and that of the middle-to-high-frequency component signal or on the basis of the result of a comparison between the detected levels of the respective low-, middle- and high-frequency component signals.

In any of the ninth to eleventh embodiments, the audio signals are amplified in the AGC circuit before they are supplied to the recording part, but only an amplifier may be employed. The comparing circuits 225 and 226 are each arranged to compare supplied detected signals and output the detected signal of the higher level, but they may be arranged to add the respective supplied detected signals together and output the results.

Any of the ninth to eleventh embodiments is arranged such that the low-frequency component signals are extracted from the respective audio signals generated from the microphones, before they are supplied to the variable filters. However, the low-frequency component signals are extracted from the audio signals passed through the respective variable filters, and the extracted low-frequency component signals may be employed to perform feedback loop control so as to control the gains of the respective variable filters relative to the low-frequency components. With this arrangement and construction, it is possible to achieve similar advantages and effects.

Figure 26:
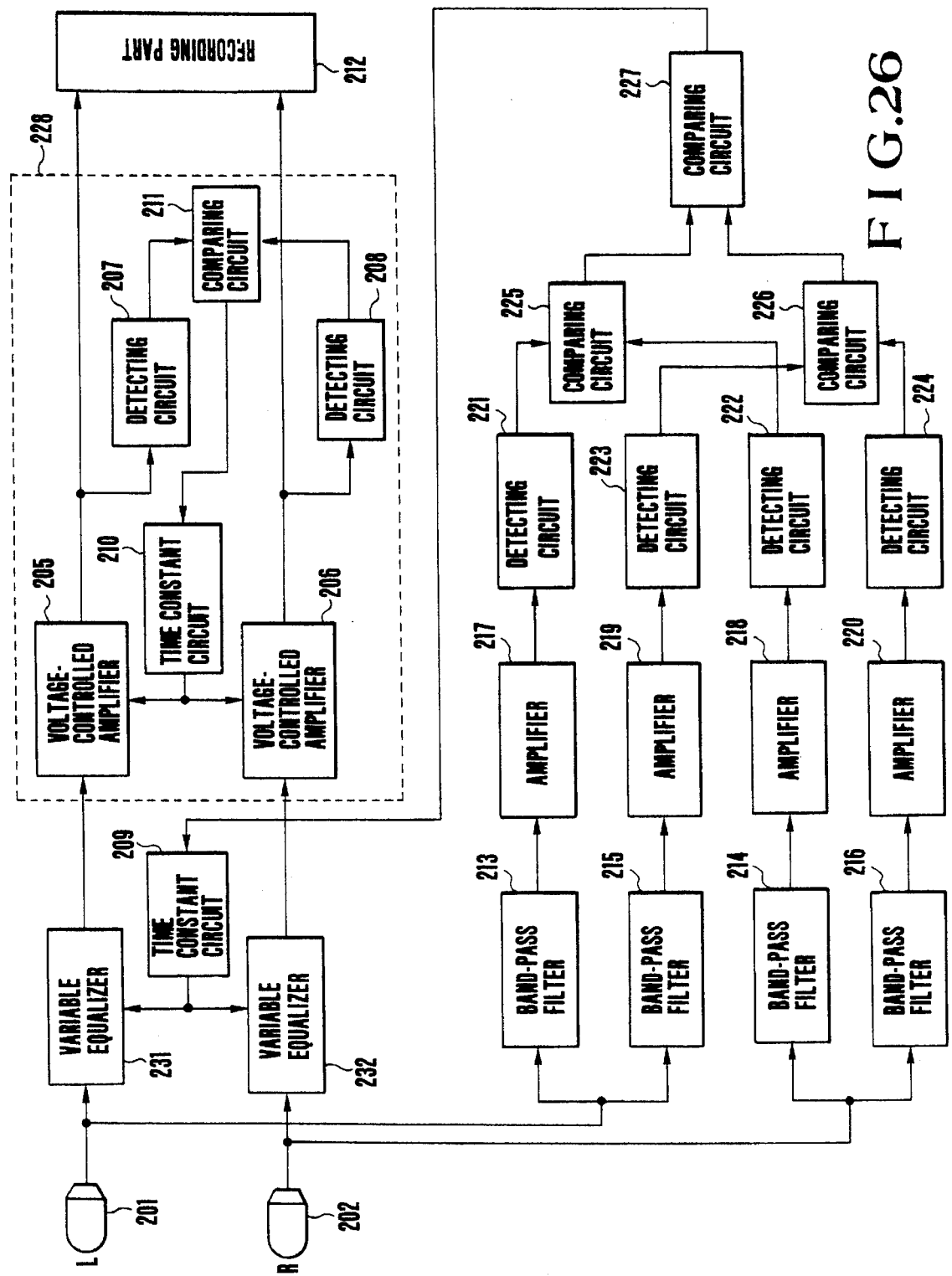
FIG. 26 is a block diagram schematically showing the arrangement and construction of a sound recording device according to a twelfth embodiment of the present invention.

FIG. 26 is a block diagram schematically showing the arrangement and construction of a sound recording device according to a twelfth embodiment of the present invention.

In the arrangement shown in FIG. 26, variable equalizers 231 and 232 are provided for varying the frequency characteristics of audio signals generated from the respective microphones 201 and 202. Since the other elements are similar to those of the ninth embodiment shown in FIG. 23, the same reference numerals are used to denote them and a detailed description thereof is omitted.

In the twelfth embodiment, the BPF 213 of FIG. 26 having the low-frequency pass band shown at L in FIG. 16 referenced previously and the BPF 215 of FIG. 26 having the middle-frequency pass band shown at M in FIG. 16 are used to extract a low-frequency band signal and a middle-frequency band signal from the signal generated from the microphone 201, respectively. In the meantime, the BPF 214 of FIG. 26 having the low-frequency pass band shown at L in FIG. 16 referenced previously and the BPF 216 of FIG. 26 having the middle-frequency pass band shown at M in FIG. 16 are used to extract a low-frequency band signal and a middle-frequency band signal from the signal generated from the microphone 202, respectively. The frequency characteristics of the respective variable equalizers 231 and 232 which are being supplied with the audio signals generated from the two respective microphones 201 and 202 are controlled according to the difference between the low-frequency detected signal whose detected level is the higher of those of the low-frequency band signals extracted from the audio signals outputted from the two respective microphones 201 and 202 and the middle-frequency detected signal whose detected level is the higher of those of the middle-frequency band signals extracted from the audio signals outputted from the two respective microphones 201 and 202, whereby the levels of the respective low-frequency components are varied as shown in FIG. 10 referenced previously or that the cut-off frequency of the low-frequency band is varied as shown in FIG. 11 referenced previously, thereby eliminating the influence of the wind noise.

The aforesaid processing operation will be described below in more detail.

The audio signals outputted from the microphones 201 and 202 of FIG. 26 are supplied to the BPFs 213 and 215 and the BPFs 214 and 216, respectively.

The BPFs 213 and 214 of FIG. 26 extract signals each of low-frequency band shown at L in FIG. 16 from the audio signals supplied from the microphones 201 and 202, respectively. The extracted signals are respectively amplified by the next-stage amplifiers 217 and 218 and are then supplied to the associated detecting circuits 221 and 222.

The detecting circuits 221 and 222 respectively detect the signals of low-frequency bands which have been extracted by the BPFs 213 and 214, and output the detected signals to the comparing circuit 225.

The comparing circuit 225 compares the levels of the low-frequency detected signals supplied from the respective detecting circuits 221 and 222, and supplies the low-frequency detected signal of the higher level to the next-stage comparing circuit 227.

The BPFs 215 and 216 of FIG. 26 extract signals each of middle-frequency band shown at M in FIG. 16 from the audio signals supplied from the microphones 201 and 202, respectively. The extracted signals are respectively amplified by the next-stage amplifiers 219 and 220 and are then supplied to the associated detecting circuits 223 and 224.

The detecting circuits 223 and 224 respectively detect the signals of middle-frequency bands which have been extracted by the BPFs 215 and 216, and output the detected signals to the comparing circuit 226.

The comparing circuit 226 compares the levels of the middle-frequency detected signals supplied from the respective detecting circuits 223 and 224, and supplies the middle-frequency detected signal of the higher level to the next-stage comparing circuit 227.

The comparing circuit 227 compares the level of the low-frequency detected signal outputted from the comparing circuit 225 with the level of the middle-frequency detected signal outputted from the comparing circuit 226. On the basis of the level difference, the comparing circuit 227 outputs a comparison signal which serves to vary the frequency characteristic of each of the variable equalizers 231 and 232 to decrease the level of the low-frequency band as the detected level of the low-frequency signal becomes higher than the detected level of the middle-frequency signal. The comparison signal is supplied to the time constant circuit 209.

The time constant circuit 209 integrates by a capacitor or the like the comparison signal outputted from the comparing circuit 227. If the level of the integrated signal exceeds a predetermined threshold, the time constant circuit 209 causes the frequency characteristic of each of the variable equalizers 231 and 232 to vary continuously in the direction in which the level of the low-frequency component is decreased, according to the level of the integrated signal, and also causes the capacitor to discharge. During the discharge of the capacitor as well, the time constant circuit 209 causes the frequency characteristic of each of the variable equalizers 231 and 232 to vary continuously in the direction in which the level of the low-frequency component is decreased. Thus, substantial impairment in auditory sound quality is prevented from being caused by the variation of the frequency characteristic which is effected by each of the variable equalizers 231 and 232 for the purpose of attenuating the wind-noise signal components (W' in FIG. 19) contained in the audio signals as shown in FIG. 19.

Then, the audio signals whose wind-noise signal components have been attenuated in the respective variable equalizers 231 and 232 are level-limited by the AGC circuit 228 so as not to exceed predetermined levels, and the resultant signals are recorded on the recording medium such as a magnetic tape in the recording part 212.

As described above, the twelfth embodiment is arranged such that the frequency characteristics of the respective variable equalizers which decrease the levels of the low-frequency components in the audio signals outputted from the microphones are varied according to the difference between the levels of the low- and middle-frequency components of such audio signals. Accordingly, it is possible to achieve appropriate attenuation control under which, if the level of the middle-frequency component is high, the level of the low-frequency component is not decreased, while if the level of the middle-frequency component is low, the level of the low-frequency component is decreased. It is, therefore, possible to prevent the wind-noise signal components contained in the audio signals from standing out auditorily. Even if the AGC is applied before the audio signals are recorded on the recording medium as shown in FIG. 26, the levels of the audio signal components to be recorded can be prevented from attenuating by the influence of the wind-noise signal components.

In addition, in the twelfth embodiment, the frequency characteristics of the variable equalizers 231 and 232 for controlling the levels of the low-frequency components in the audio signals generated from the respective microphones 201 and 202 are both controlled by the comparison signal generated from the comparing circuit 227. Accordingly, it is possible to keep the balance of frequency characteristics between the audio signals generated from the respective microphones 201 and 202 which are employed as a stereophonic microphone system.

Figure 27:
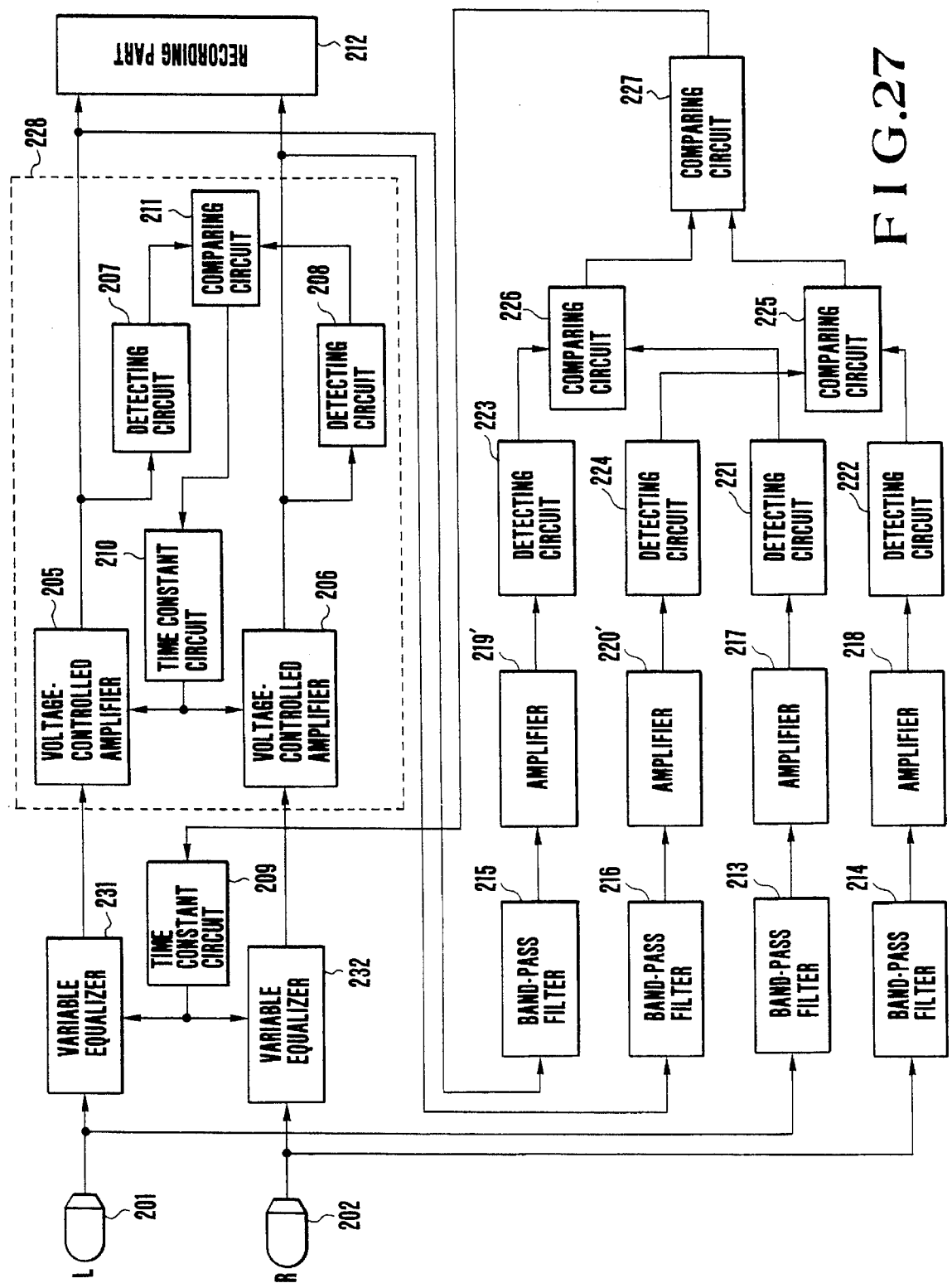
FIG. 27 is a block diagram schematically showing the arrangement and construction of a sound recording device according to a thirteenth embodiment of the present invention.

FIG. 27 is a block diagram schematically showing the arrangement and construction of a sound recording device according to a thirteenth embodiment of the present invention. In FIG. 27, the same reference numerals are used to denote elements which are similar to those of the twelfth embodiment shown in FIG. 26, and a detailed description thereof is omitted.

The embodiment shown in FIG. 27 is arranged such that a low-frequency component signal and a middle-frequency component signal are extracted from each of audio signals which are generated from the respective microphones 201 and 202, before they are supplied to the variable equalizers 231 and 232. However, in the above-described arrangement, it is necessary to increase the amplification factors of the respective amplifiers 219 and 220 which amplify the extracted middle-frequency component signals. To realize such an increase in amplification factor the cost increase, since a large number of parts are needed.

As shown in FIG. 27, the middle-frequency component signals in the audio signals which are not varied in frequency characteristic by the respective variable equalizers 231 and 232 are extracted by the BPFs 215 and 216 from the audio signals which have been amplified in the AGC circuit 228 so as not to exceed the respective predetermined levels. Accordingly, there is no need to increase the amplification factor of either of the amplifiers 219' and 220' connected to the output sides of the BPFs 215 and 216, and the amplification factors of the amplifiers 219' and 220' can be made smaller than those of the amplifiers 219 and 220 shown in FIG. 26. With the above-described arrangement and construction, it is possible to achieve advantages and effects which are similar to those of the twelfth embodiment shown in FIG. 26 and it is also possible to reduce the number of parts and simplify the arrangement and construction, thereby enabling a reduction in cost.

Figure 28:
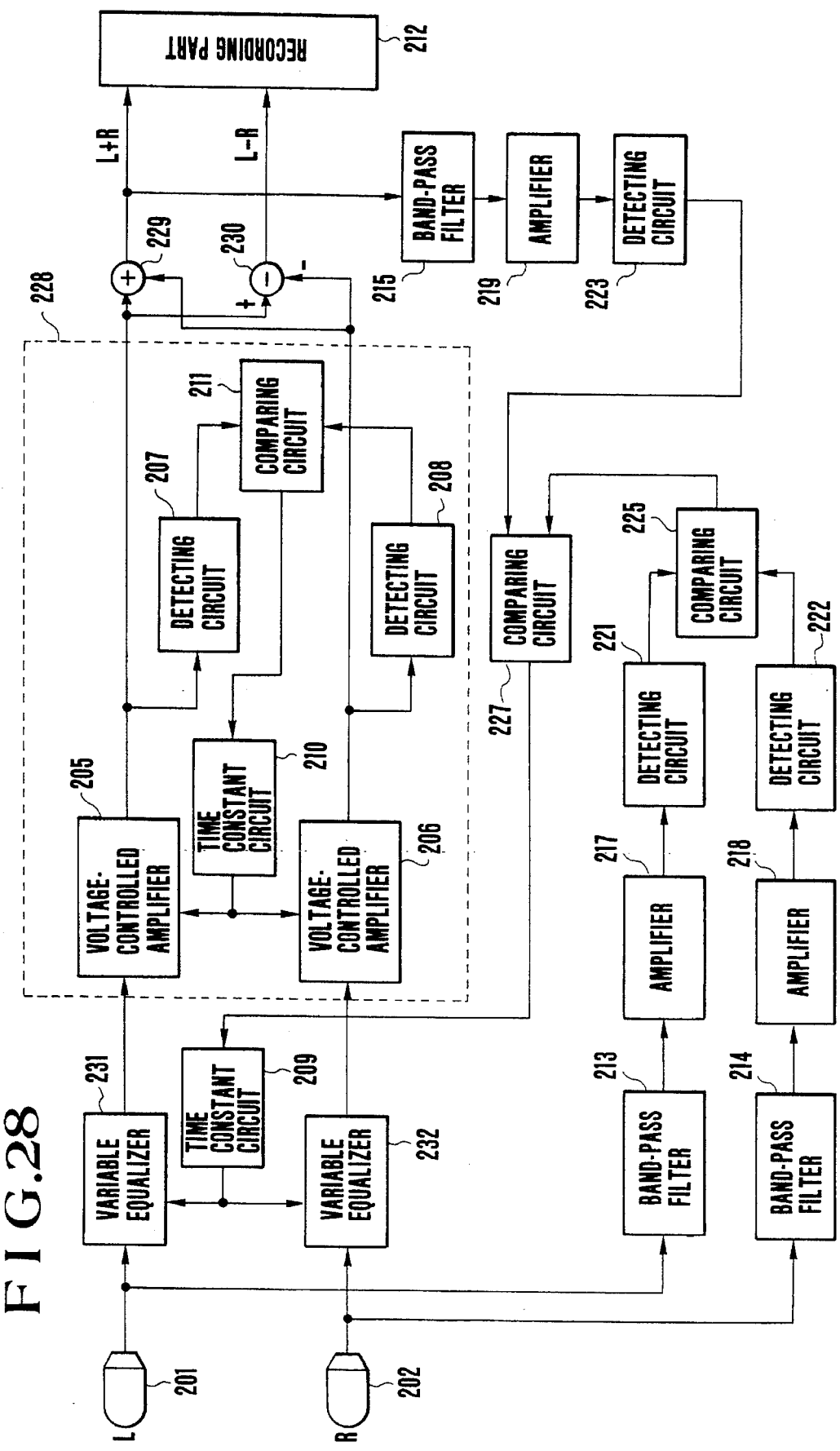
FIG. 28 is a block diagram schematically showing the arrangement and construction of a sound recording device according to a fourteenth embodiment of the present invention.

The thirteenth embodiment shown in FIG. 27 is arranged such that the middle-frequency component signals are respectively extracted by the BPFs 215 and 216 from the audio signals generated from the microphone 201 and the microphone 202. In the fourteenth embodiment shown in FIG. 28, the left-side audio signal generated from the microphone 201 and the right-side audio signal generated from the microphone 202 are added together by the adder 229 to form a sum signal, while the left-side audio signal and the right-side audio signal are subtracted from each other by the subtracter 230 to form a difference signal. The thus-converted signals are recorded on the recording medium. In such a sound recording device, the middle-frequency component signal is extracted from the sum signal outputted from the adder 229 by the BPF 215, and the extracted signal is amplified by the amplifier 219 and is then detected by the detecting circuit 223. The detected signal is supplied to the comparing circuit 227. Thus, it is possible to achieve advantages and effects which are similar to those of the thirteenth embodiment shown in FIG. 27, and since the BPF 216, the amplifier 220', the detecting circuit 224 and the comparing circuit 226 which are shown in FIG. 27 can be omitted, it is possible to simplify the arrangement and construction and realize a reduction in cost.

As described above, any of the twelfth to fourteenth embodiments is arranged such that the low-frequency component signal and the middle-frequency component signal in each of the audio signals outputted from the respective microphones are extracted and the characteristics of the variable equalizers which vary the low-frequency characteristics of the respective audio signals are controlled according to the difference between the levels of the low- and middle-frequency components. The characteristics of the respective variable equalizers may be controlled on the basis of the difference between the detected level of the low-frequency component signal and that of the middle-tohigh-frequency component signal or on the basis of the result of a comparison between the detected levels of the respective low-, middle- and high-frequency component signals.

In any of the twelfth to fourteenth embodiments, the audio signals are amplified in the AGC circuit before they are supplied to the recording part, but only an amplifier may be employed. The comparing circuits 225 and 226 are each arranged to compare supplied detected signals and output the detected signal of the higher level, but they may be arranged to add the respective supplied detected signals together and output the results.

Any of the twelfth to fourteenth embodiments is arranged such that the low-frequency component signals are extracted from the respective audio signals generated from the microphones, before they are supplied to the variable equalizers. However, the low-frequency component signals are extracted from the audio signals passed through the respective variable equalizers, and the extracted low-frequency component signals may be employed to perform feedback loop control so as to control the gains of the respective variable equalizers relative to the low-frequency components. With this arrangement and construction, it is possible to achieve similar advantages and effects.

As is apparent from the foregoing description, according to any of the ninth to fourteenth embodiments, it is possible to provide a sound processing device which is capable of easily processing sound without suffering the influence of wind noise or the like, without the need to increase the size of the device and by means of a simple arrangement and construction.

Figure 29:
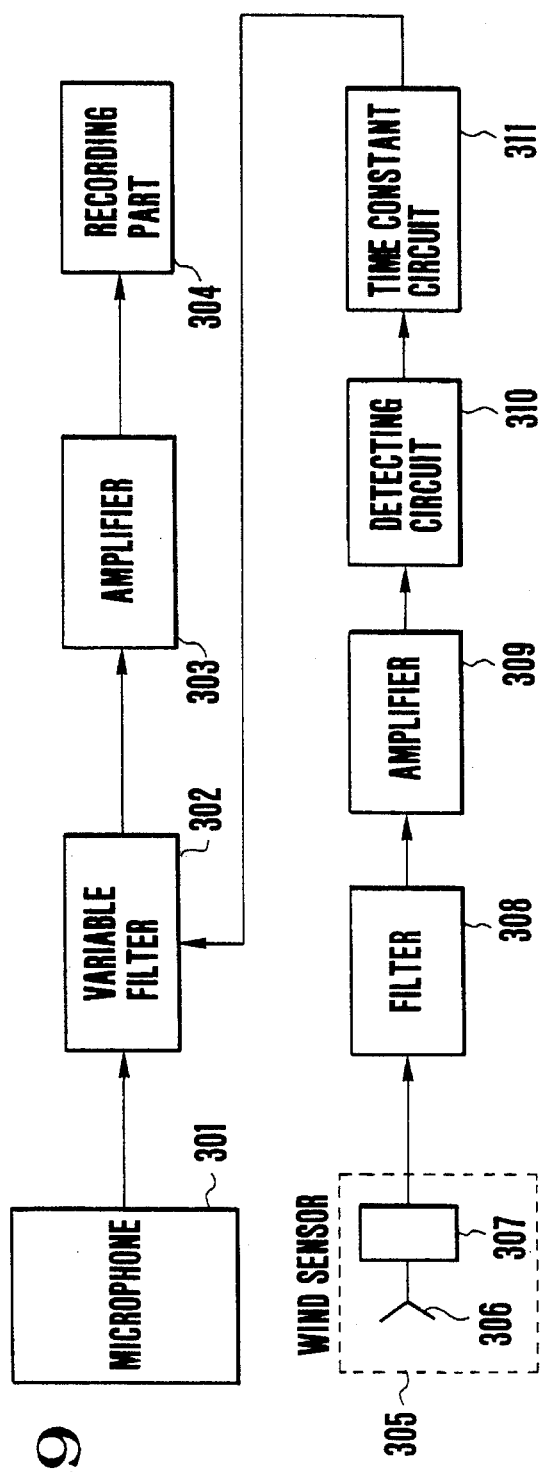
FIG. 29 is a block diagram schematically showing the arrangement and construction of a sound recording device according to a fifteenth embodiment of the present invention.

FIG. 29 is a block diagram schematically showing the arrangement and construction of a sound recording device according to a fifteenth embodiment of the present invention.

The arrangement shown in FIG. 29 includes a microphone 301 for converting sound into an electrical signal, a variable filter 302 for varying the frequency characteristic of an audio signal generated from the microphone 301, an amplifier 303 for amplifying the audio signal outputted from the variable filter 302, a recording part 304 for recording the audio signal amplified by the amplifier 303 on a recording medium such as a magnetic tape, and a wind sensor 305 for sensing the presence or absence of wind. The wind sensor 305 is made up of a vibration sheet 306 which vibrates according to the flow of air and a mechanical-electrical conversion element 307, such as a piezoelectric element, which converts the motion of the vibration sheet 306 into an electrical signal and generates a frequency signal corresponding to the motion of the vibration sheet 306. The arrangement shown in FIG. 29 also includes a filter 308 for extracting a signal of frequency band indicative of the occurrence of wind from the frequency signal generated from the mechanical-electrical conversion element 307 in the wind sensor 305, an amplifier 309 for amplifying the frequency signal outputted from the filter 308, and a time constant circuit 311, which is controlled according to the detected signal outputted from the detecting circuit 310, for setting an attack recovery time to prevent the variation of the frequency characteristic provided by the variable filter 302 from leading to substantial impairment in auditory sound quality.

In the arrangement shown in FIG. 29, the sound collected by the microphone 301 is converted into an electrical signal (i.e., an audio signal) and is then supplied to the variable filter 302.

As shown in FIG. 4 referenced previously, except for special cases, the frequency characteristic of the signal outputted from the microphone 301 shows a distribution in which the frequency characteristic of the sound is distributed over a frequency range centered at approximately 1 kHz. To eliminate the influence of wind noise, typical sound amplifying circuits in tape recorders or the like are arranged to attenuate the signal component of the wind noise (W' in FIG. 6) by attenuating the portion of the audio signal which is 100 Hz or lower, as shown in FIG. 6 referenced previously. However, since the frequency characteristic of the wind noise is distributed up to a frequency of 100 Hz or higher, if the portion of the audio signal which is 100 Hz or lower is attenuated, the high-frequency component of the wind noise which may have a frequency band of, for example, 50–200 Hz will remain unattenuated and the quality of the sound to be recorded will be degraded.

In the fifteenth embodiment, as shown in FIG. 5 referenced previously, a signal of frequency band (for example, 10–70 Hz) shown at B in FIG. 5 is extracted by the filter 308 from the frequency signal generated from the wind sensor 305 of FIG. 29 with respect to the frequency band (shown at A in FIG. 5) of the sound to be recorded. The extracted frequency signal is detected by the detecting circuit 310, and whether wind has occurred is detected on the basis of the detected level of the detected signal obtained through the detection. Thus, the signal-pass characteristic of the variable filter 302 which is being supplied with the audio signal generated from the microphone 301 is controlled in such a manner that the amount of attenuation of the low-frequency signal is varied as shown in FIG. 2 referenced previously or that the cut-off frequency of the low-frequency band is varied as shown in FIG. 3, thereby eliminating the influence of the wind noise.

The aforesaid processing operation will be described below in more detail.

The signal of frequency band shown at B in FIG. 5 is extracted by the filter 308 from the frequency signal which has been generated from the wind sensor 305 of FIG. 29 at the time of the occurrence of wind. The extracted signal is amplified by the next-stage amplifier 309 and is then supplied to the detecting circuit 310.

The detecting circuit 310 detects the frequency signal outputted from the amplifier 309, and outputs the detected signal to the time constant circuit 311.

The time constant circuit 311 integrates by a capacitor or the like the detected signal outputted from the detecting circuit 310. If the level of the integrated signal exceeds a predetermined threshold, the time constant circuit 311 causes the band-pass characteristic of the variable filter 302 to vary continuously in the direction in which the low-frequency component is attenuated, according to the level of the integrated signal, and also causes the capacitor to discharge. During the discharge of the capacitor as well, the time constant circuit 311 causes the band-pass characteristic of the variable filter 302 to vary continuously in the direction in which the low-frequency component is attenuated. Thus, substantial impairment in auditory sound quality is prevented from being caused by the variation of the frequency characteristic which is effected by the variable filter 302 for the purpose of attenuating the wind-noise signal component (W" in FIG. 7) contained in the audio signal as shown in FIG. 7 referenced previously.

Then, the audio signal whose wind-noise signal component has been attenuated in the variable filter 302 is amplified by the amplifier 303 and is subsequently recorded on the recording medium such as a magnetic tape in the recording part 304.

As described above, the fifteenth embodiment is arranged such that the frequency characteristic of the variable filter which attenuates the low-frequency component in the audio signal outputted from the microphone is varied according to the strength of wind sensed by the wind sensor. Accordingly, it is possible to attenuate the wind-noise signal component contained in the audio signal, and even if, for example, AGC is applied before the audio signal is recorded on the recording medium, the level of the audio signal component to be recorded can be prevented from attenuating by the influence of the wind-noise signal component.

Figure 30:
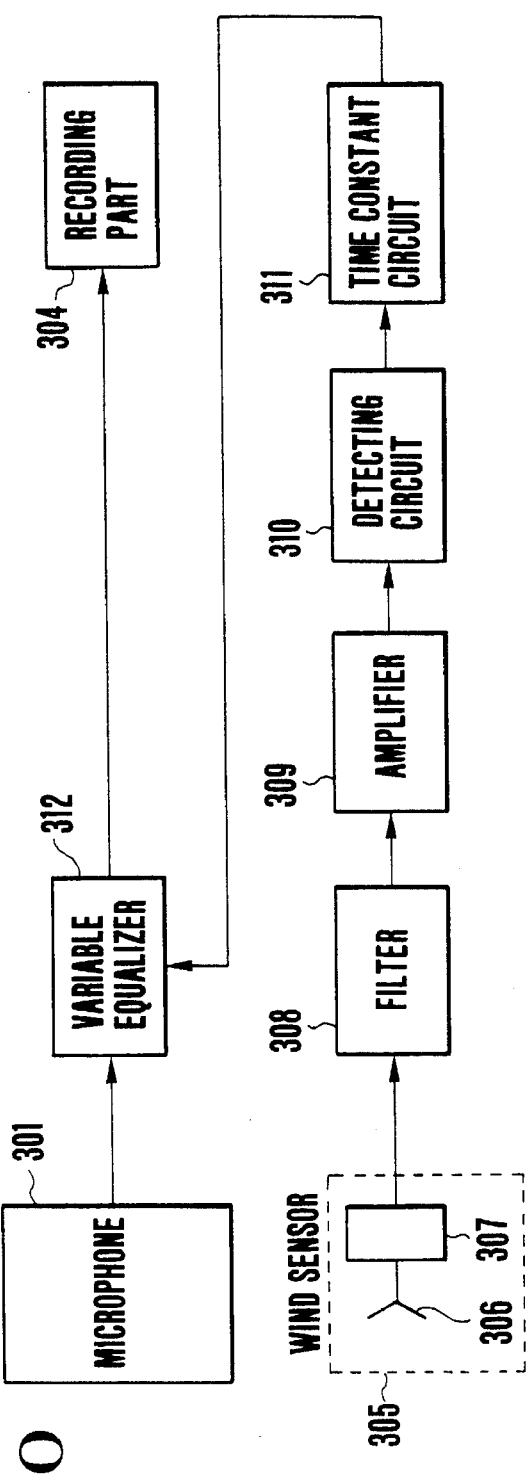
FIG. 30 is a block diagram schematically showing the arrangement and construction of a sound recording device according to a sixteenth embodiment of the present invention.

FIG. 30 is a block diagram schematically showing the arrangement and construction of a sound recording device according to a sixteenth embodiment of the present invention.

In the arrangement shown in FIG. 30, a variable equalizer 312 is provided for varying the frequency characteristic of an audio signal generated from the microphone 301. Since the other elements are similar to those of the fifteenth embodiment shown in FIG. 29, the same reference numerals are used to denote them and a detailed description thereof is omitted.

In the sixteenth embodiment, the signal of frequency band shown at B (for example, 10–70 Hz) in the frequency signal generated from the wind sensor 305 of FIG. 30 is extracted by the filter 308 with respect to the frequency band (indicated at A in FIG. 5) of the sound to be recorded, as shown in FIG. 5 referenced previously. The extracted frequency signal is detected by the detecting circuit 310, and whether wind has occurred is detected on the basis of the detected level of the detected signal obtained through the detection. Thus, the frequency characteristic of the variable equalizer 312 which is being supplied with the audio signal generated from the microphone 301 is controlled in such a manner that the level of the low-frequency component is varied as shown in FIG. 10 referenced previously or that the cut-off frequency of the low-frequency band is varied as shown in FIG. 11 referenced previously, thereby eliminating the influence of the wind noise.

The aforesaid processing operation will be described below in more detail.

The signal of frequency band shown at B in FIG. 5 is extracted by the filter 308 from the frequency signal which has been generated from the wind sensor 305 of FIG. 30 at the time of the occurrence of wind. The extracted signal is amplified by the next-stage amplifier 309 and is then supplied to the detecting circuit 310.

The detecting circuit 310 detects the frequency signal outputted from the amplifier 309, and outputs the detected signal to the time constant circuit 311.

The time constant circuit 311 integrates by the capacitor or the like the detected signal outputted from the detecting circuit 310. If the level of the integrated signal exceeds a predetermined threshold, the time constant circuit 311 causes the frequency characteristic of the variable equalizer 312 to vary continuously in the direction in which the level of the low-frequency component is attenuated, according to the level of the integrated signal, and also causes the capacitor to discharge. During the discharge of the capacitor as well, the time constant circuit 311 causes the frequency characteristic of the variable equalizer 312 to vary continuously in the direction in which the level of the low-frequency component is attenuated. Thus, substantial impairment in auditory sound quality is prevented from being caused by the variation of the frequency characteristic which is effected by the variable equalizer 312 for the purpose of attenuating the wind-noise signal component (W" in FIG. 7) contained in the audio signal as shown in FIG. 7 referenced previously.

Then, the audio signal whose wind-noise signal component has been attenuated in the variable equalizer 312 is recorded on the recording medium such as a magnetic tape in the recording part 304.

As described above, the sixteenth embodiment is arranged such that the frequency characteristic of the variable equalizer which decreases the level of the low-frequency component in the audio signal outputted from the microphone is varied according to the strength of wind sensed by the wind sensor. Accordingly, it is possible to attenuate the wind-noise signal component contained in the audio signal, and even if, for example, AGC is applied before the audio signal is recorded on the recording medium, the level of the audio signal component to be recorded can be prevented from attenuating by the influence of the wind-noise signal component.

Either of the fifteenth and sixteenth embodiments employs a wind sensor which is made up of a vibration sheet and a mechanical-electrical conversion element such as a piezoelectric element, but only a piezoelectric element may be used as a wind sensor. Otherwise, a switch which is turned on or off according to the presence or absence of wind or a sensor which varies the resistance value by means of a photocoupler, depending on the strength of wind, may also be used as a wind sensor. In either case, it is possible to achieve similar advantages and effects.

In addition, the aforesaid wind sensor may be arranged in the vicinity of the microphone, or the wind sensor and the microphone may be arranged in a common case. With this arrangement, since the wind sensor can sense wind strength approximately equal to the strength of wind which is blowing against the microphone, it is possible to accurately eliminate the influence of the wind noise.

As is apparent from the foregoing description, according to either of the fifteenth and sixteenth embodiments, it is possible to provide a sound processing device which is capable of easily processing sound without suffering the influence of wind noise or the like, without the need to increase the size of the device and by means of a simple arrangement and construction.

Figure 31:
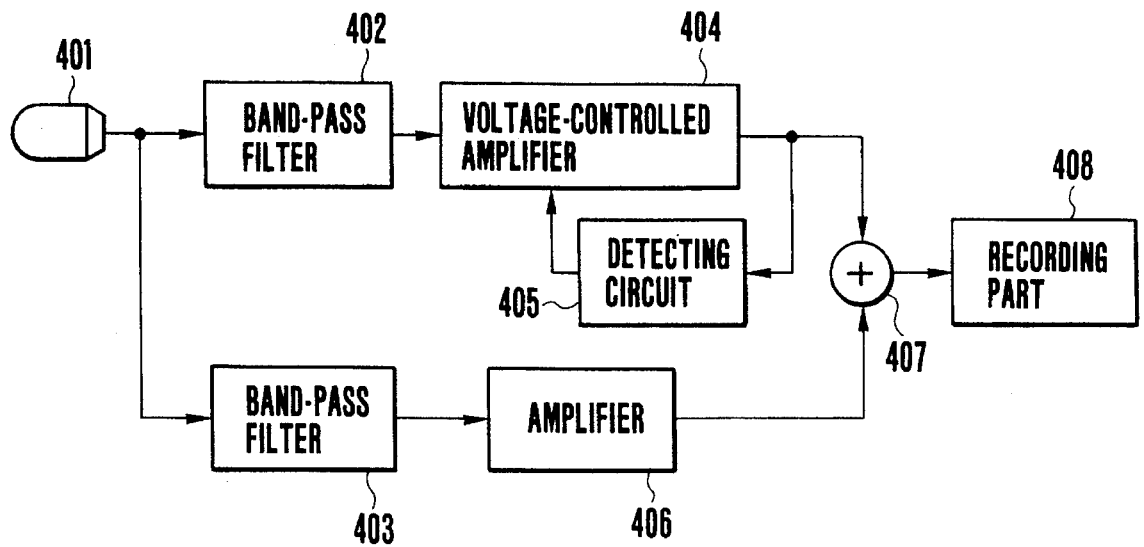
FIG. 31 is a block diagram schematically showing the arrangement and construction of a sound recording device according to a seventeenth embodiment of the present invention.

FIG. 31 is a block diagram schematically showing the arrangement and construction of a sound recording device according to a seventeenth embodiment of the present invention.

The arrangement shown in FIG. 31 includes a microphone 401 for converting sound into an electrical signal, a band-pass filter 402 for separating a low-frequency component from the audio signal generated from the microphone 401, and a band-pass filter 403 for separating a middle-to-high-frequency component from the audio signal generated from the microphone 401. The signal-pass characteristic of each of the band-pass filters 402 and 403 is determined as shown in FIG. 16 referenced previously. (In FIG. 16, "L" indicates the signal-pass characteristic of the band-pass filter 402 and "M" indicates that of the band-pass filter 403.) The signal of the middle-to-high-frequency component separated by the band-pass filter 403 from the audio signal generated from the microphone 401 is subjected to predetermined amplification in the amplifier 406, and is then supplied to an adder 407.

In the meantime, the signal of the low-frequency component separated from the audio signal by the band-pass filter 402 is supplied to an AGC (Automatic Gain Control) circuit made up of a voltage-controlled amplifier 404 and a detecting circuit 405 including a time constant circuit.

The voltage-controlled amplifier 404 controls the amplification factor relative to the input signal, according to the voltage level of a detected signal obtained by detecting the signal outputted from the voltage-controlled amplifier 404 by the detecting circuit 405. The voltage-controlled amplifier 404 performs gain control so that the signal of the low-frequency component separated from the audio signal by the band-pass filter 402 does not exceed a predetermined level. The resultant signal is supplied to the adder 407.

The adder 407 adds together the signal of the middle-to-high-frequency component in the audio signal, which has been amplified by the amplifier 406 as described above, and the signal of the low-frequency component in the audio signal, which has been amplified by the voltage-controlled amplifier 404 under the gain control. The addition result is recorded on a recording medium such as a magnetic tape in the next-stage recording part 408.

Figure 32:
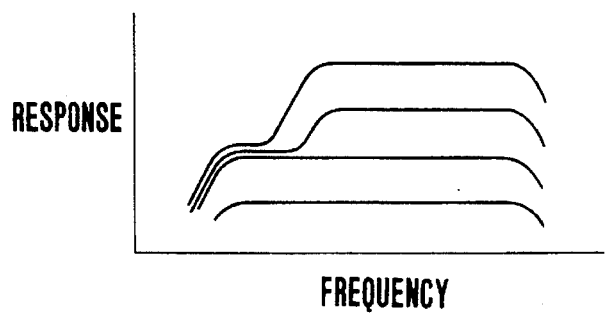
FIG. 32 is an illustration showing the frequency characteristic of a signal outputted from an adder in the sound recording device shown in FIG. 31.

FIG. 32 is an illustration showing the frequency characteristic of the audio signal outputted from the adder 407 in the sound recording device shown in FIG. 31.

As shown in FIG. 32, if the level of the audio signal becomes higher, the level of the low-frequency component only is limited by the AGC circuit made up of the voltage-controlled amplifier 404 and the detecting circuit 405.

Accordingly, unlike the conventional arrangement in which the low-frequency component of the audio signal is reduced irrespective of the level of the audio signal, according to the arrangement and construction shown in FIG. 31, if the level of the audio signal is low, the low-frequency component of the audio signal is not reduced, and as the level of the audio signal becomes higher, the low-frequency component of the audio signal is reduced accordingly, whereby the influence of the wind-noise signal component contained in the audio signal is eliminated.

Figure 33:
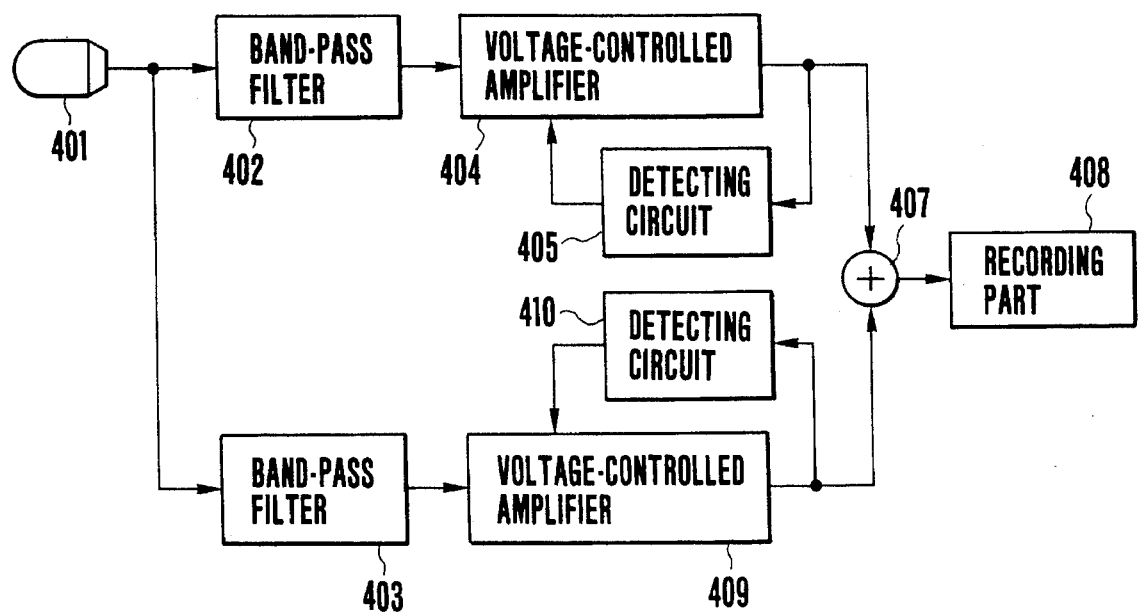
FIG. 33 is a block diagram schematically showing the arrangement and construction of a sound recording device according to an eighteenth embodiment of the present invention.

FIG. 33 is a block diagram schematically showing the arrangement and construction of a sound recording device according to an eighteenth embodiment of the present invention.

In FIG. 33, the same reference numerals are used to denote elements which are similar to those of the sound recording device shown in FIG. 31, and a detailed description thereof is omitted.

It is general practice to record an audio signal on a recording medium after it has been subjected to AGC.

It is preferable, therefor, that an AGC circuit be disposed between the adder 407 and the recording part 408 of FIG. 31 referenced above so that after AGC has been applied to an audio signal outputted from the adder 407 by the AGC circuit, the audio signal is recorded on a recording medium in the recording part 408.

However, the position in which the AGC circuit is disposed is not limited to the next stage of the adder 407, and the AGC circuit may be disposed in the next stage of the band-pass filter 403 for separating a middle-to-high-frequency component from an audio signal, as shown in FIG. 33. With this arrangement as well, it is possible to achieve similar advantages and effects.

Referring to FIG. 33, a voltage-controlled amplifier 409 and a detecting circuit 410 constitute an AGC circuit for the middle-to-high-frequency component of an audio signal.

An AGC level relative to the middle-to-high-frequency component of an audio signal, which is controlled by the AGC circuit made up of the voltage-controlled amplifier 409 and the detecting circuit 410, is selected to be higher than an AGC level relative to the low-frequency component of an audio signal, which is controlled by an AGC circuit made up of the voltage-controlled amplifier 404 and the detecting circuit 405.

Either of the sound recording device according to the seventeenth embodiment of the present invention shown in FIG. 31 or the sound recording device according to the eighteenth embodiment of the present invention shown in FIG. 33 is arranged to eliminate the influence of a wind-noise signal in such a manner that if the level of the audio signal is low, the low-frequency component is not attenuated and as the level of the audio signal becomes higher, the low-frequency component is attenuated accordingly.

Figure 34:
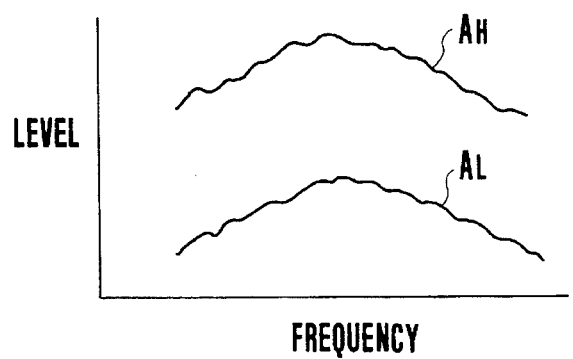
FIG. 34 is an illustration showing the frequency characteristic of an audio signal.
Figure 35:
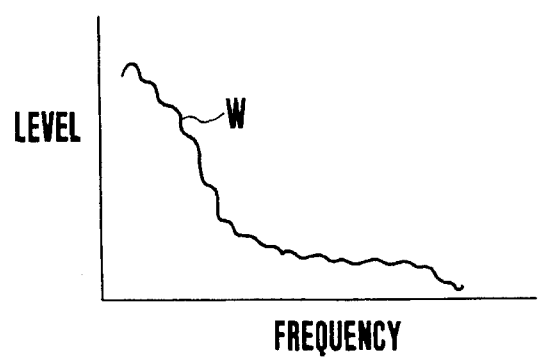
FIG. 35 is an illustration showing the frequency characteristic of a wind-noise signal.

As is known, as shown in FIG. 34, the frequency characteristic of the audio signal is widely distributed over a frequency range centered at approximately 1 kHz irrespective of the level of the audio signal. (In FIG. 34, a curve $A_H$ indicates the frequency characteristic of an audio signal of high level and a curve $A_L$ indicates that of an audio signal of low level). The frequency characteristic of the wind-noise signal is distributed over a low-frequency range which is 200 Hz or lower, as shown in FIG. 35.

In the case of either of the sound recording devices shown in FIGS. 31 and 33, if the level of an audio signal is high, the low-frequency component of the audio signal will be attenuated together with the wind-noise signal component.

Figure 36:
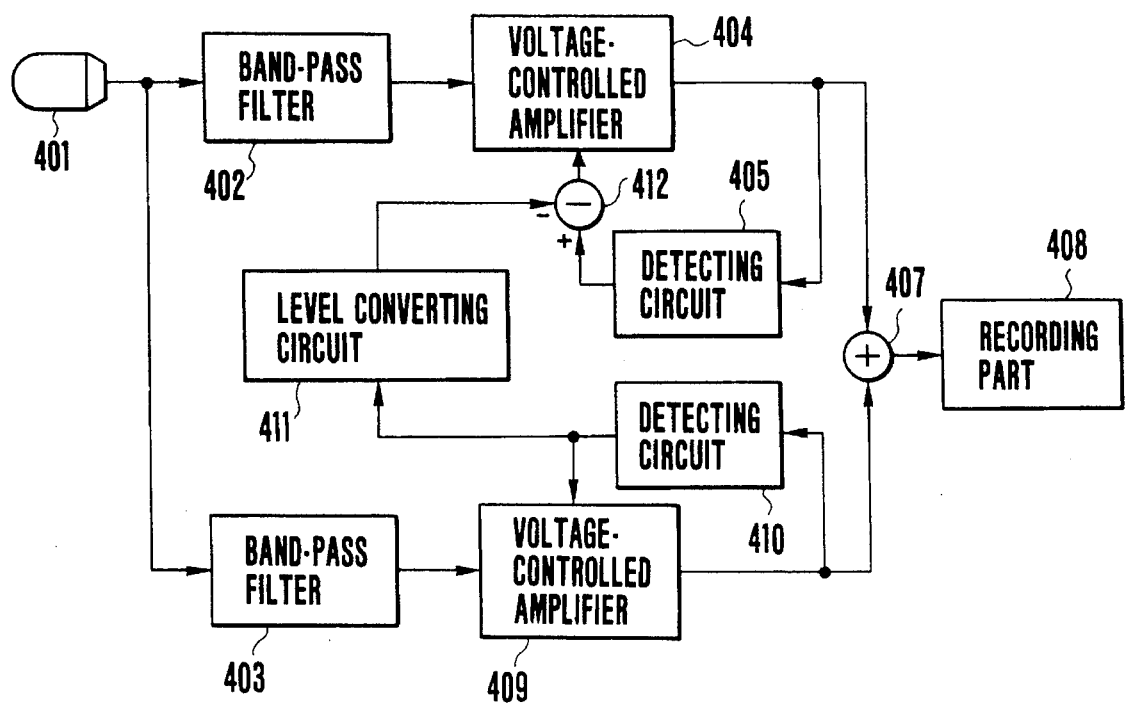
FIG. 36 is a block diagram schematically showing the arrangement and construction of a sound recording device according to a nineteenth embodiment of the present invention.

FIG. 36 is a block diagram schematically showing the arrangement and construction of a sound recording device according to a nineteenth embodiment of the present invention.

In FIG. 36, the same reference numerals are used to denote elements which are similar to those of either of the sound recording devices shown in FIGS. 31 and 33, and a detailed description thereof is omitted.

Referring to FIG. 36, a low-frequency component is separated by the band-pass filter 402 from an audio signal generated from the microphone 401, and is then supplied to the voltage-controlled amplifier 404. The middle-to-high-frequency component of the audio signal, separated by the band-pass filter 403, is supplied to the voltage-controlled amplifier 409. The gain characteristics of the respective voltage-controlled amplifiers 404 and 409 are set as shown in FIG. 37.

Figure 37:
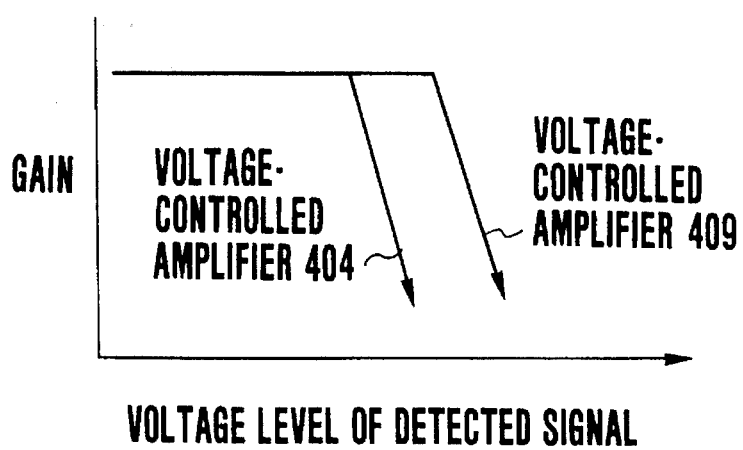
FIG. 37 is an illustration showing the gain characteristics of the respective voltage-controlled amplifiers in the sound recording device shown in FIG. 36.

In the sound recording device shown in FIG. 36, the gain of the voltage-controlled amplifier 409 is controlled on the basis of the characteristic shown in FIG. 37 according to the voltage level of the detected signal outputted from the detecting circuit 410 which detects the signal outputted from the voltage-controlled amplifier 409. The gain of the voltage-controlled amplifier 404 is controlled on the basis of the characteristic shown in FIG. 37 according to the difference between the voltage level of the detected signal outputted from the detecting circuit 405 which detects the signal outputted from the voltage-controlled amplifier 404 and the voltage level of the detected signal outputted from the detecting circuit 410.

More specifically, the detected signal obtained by detecting in the detecting circuit 405 the low-frequency component of the audio signal outputted from the voltage-controlled amplifier 404 is supplied to the positive terminal of a subtracter 412, while the detected signal obtained by detecting in the detecting circuit 410 the middle-to-high-frequency component of the audio signal outputted from the voltage-controlled amplifier 409 is level-converted by a level converting circuit 411 and supplied to the negative terminal of the subtracter 412. The subtracter 412 subtracts the detected signal which has been outputted from the detecting circuit 410 and level-converted by the level converting circuit 411, from the detected signal outputted from the detecting circuit 405, and supplies the resultant signal to the voltage-controlled amplifier 404. The voltage-controlled amplifier 404 is gain-controlled according to the level of the signal outputted from the subtracter 412.

The level converting circuit 411 is a non-linear circuit which causes the level of the detected signal outputted from the detecting circuit 410 to increase further if the level exceeds a predetermined level, thereby correcting the lowering of the level of the low-frequency component of the audio signal due to the difference between the gain characteristics of the respective voltage-controlled amplifiers 404 and 409, as shown in FIG. 37, in a case where the level of the detected signal outputted from the detecting circuit 410 is relatively high.

As described above, in the sound recording device shown in FIG. 36, as the level of the middle-to-high-frequency component of the audio signal becomes higher, the AGC level relative to the low-frequency component of the audio signal is made higher by the operations of the subtracter 412 and the level converting circuit 411 of FIG. 36. Accordingly, if the level of the audio signal becomes high, it is possible to prevent the level of the low-frequency component from lowering as in the case of either of the sound recording devices shown in FIGS. 31 and 33.

Figure 38:
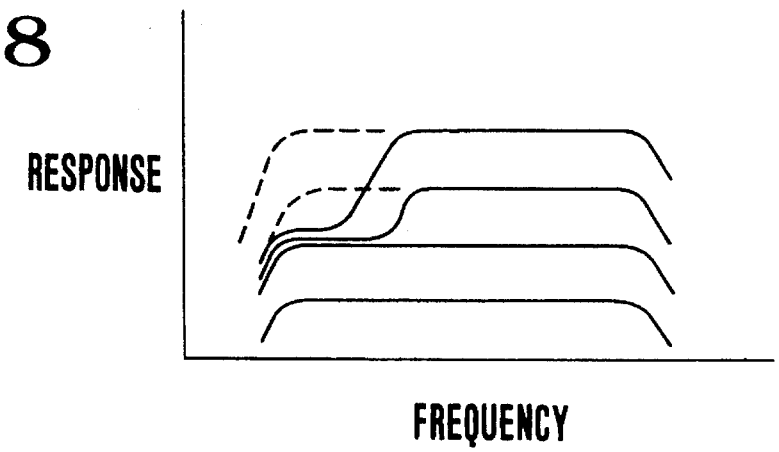
FIG. 38 is an illustration showing the frequency characteristic of a signal outputted from an adder in the sound recording device shown in FIG. 36.

The frequency characteristic of the sound recording device shown in FIG. 36 is as shown by dashed lines in FIG. 38 (The solid lines of FIG. 38 show the frequency characteristic of each of the sound recording devices of FIGS. 31 and 33).

Figure 39:
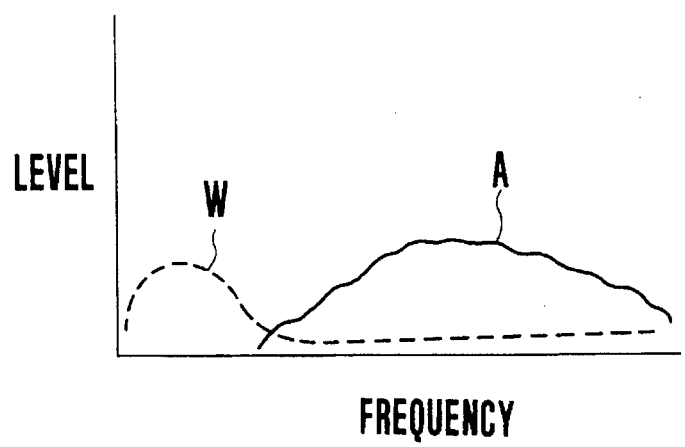
FIG. 39 is an illustration showing the frequency characteristic of a signal which is outputted from the adder if the level of an audio signal component contained in an audio signal generated from a microphone in the sound recording device of FIG. 36 is low.

In the sound recording device shown in FIG. 36, if an audio signal, in which the wind-noise signal component W is higher in level than the audio signal component A containing a middle-to-high-frequency component as shown in FIG. 14 referenced previously, is outputted from the microphone 401 as shown in FIG. 14, the adder 407 outputs a signal in which the wind-noise signal component W is reduced in the state shown in FIG. 39. If an audio signal, in which the audio signal component A containing a middle-to-high-frequency component is higher in level than the wind-noise signal component W, is outputted from the microphone 401, the level of the wind-noise signal component W is not decreased, as shown in FIG. 15. In this case, however, since the level of the audio signal component A is sufficiently high, the wind-noise signal component W is prevented from standing out auditorily seriously.

The nineteenth embodiment is arranged in such a manner that the audio signal generated from the single microphone 401 is separated into the audio signal of low frequency and the audio signal of middle and high frequency by the band-pass filters 402 and 403 for processing purposes. However, two microphones may also be employed in such a manner that one is used for sound of low frequency and the other is used for sound of middle and high frequency. In this arrangement, an audio signal generated from the microphone for low-frequency sound is supplied to the band-pass filter 402, while an audio signal generated from the microphone for middle-to-high-frequency sound is supplied to the band-pass filter 403. If an omnidirectional microphone is used as a microphone for sound of low frequency and a unidirectional microphone is used as a microphone for sound of middle-to-high-frequency, it is possible to record an audio signal on a recording medium while preventing the influence of wind noise more accurately.

As is apparent from the foregoing description, according to any of the seventeenth to nineteenth embodiments, it is possible to provide a sound processing device which is capable of easily processing sound without suffering the influence of wind noise or the like, without the need to increase the size of the device and by means of a simple arrangement and construction.

Figure 40:
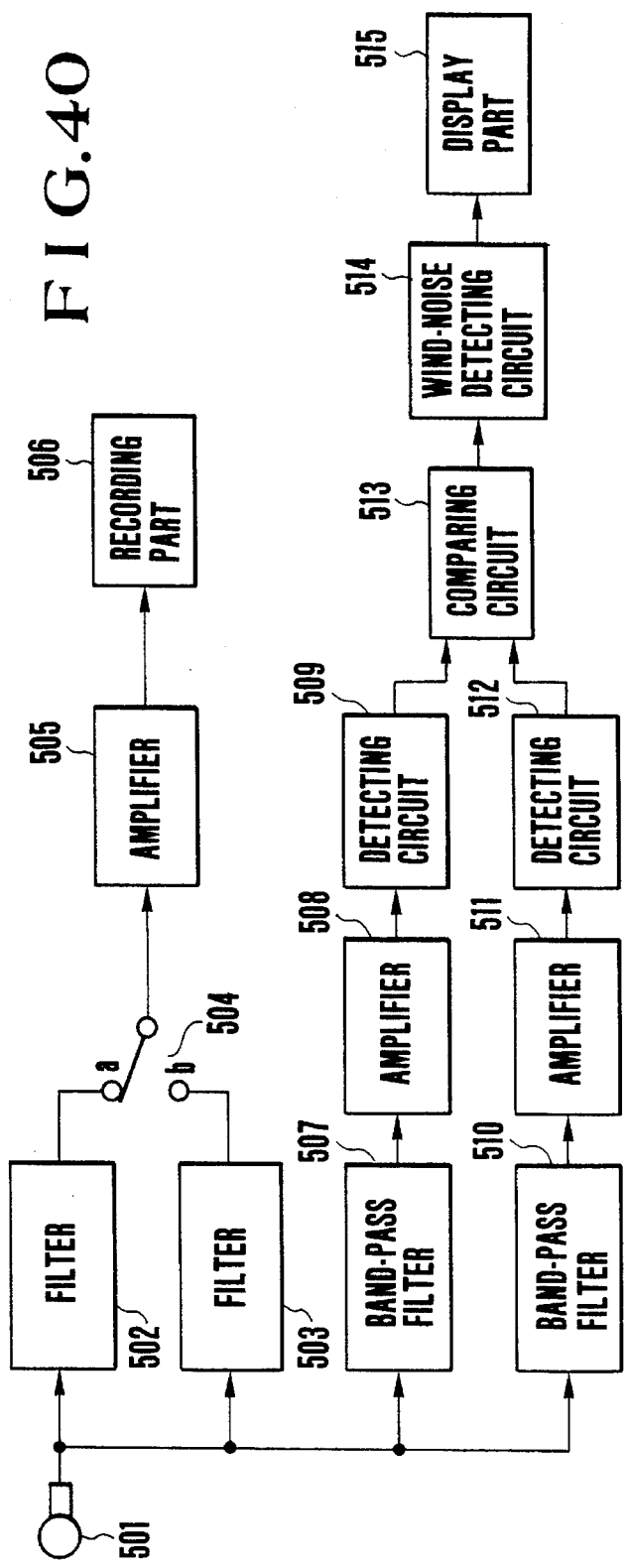
FIG. 40 is a block diagram schematically showing the arrangement and construction of a sound recording device according to a twentieth embodiment of the present invention.

FIG. 40 is a block diagram schematically showing the arrangement and construction of a sound recording device according to a twentieth embodiment of the present invention.

Figure 41:
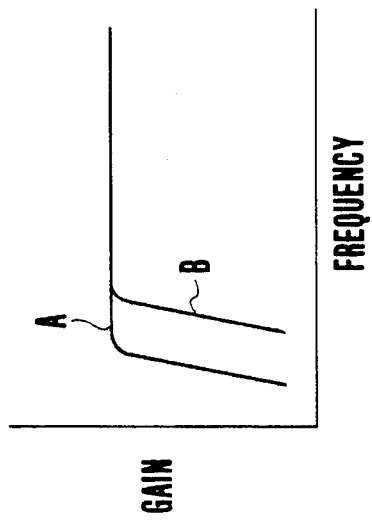
FIG. 41 is an illustration showing the frequency characteristic of a variable filter in the sound recording device shown in FIG. 40.

The arrangement shown in FIG. 40 includes a microphone 504 for converting sound into an electrical signal, and filters 502 and 503 for varying the frequency characteristic of an audio signal generated from the microphone 501. The filter 502 has a signal-pass characteristic such as that shown by a curve A in FIG. 41, and the filter 503 has a signal-pass characteristic, such as that shown by a curve B in FIG. 41, which has a low-frequency-component attenuation effect higher than the filter 502.

The arrangement shown in FIG. 40 also includes a selecting switch 505 for selectively switching and outputting the audio signal passed through the filter 502 or the audio signal passed through the filter 503, an amplifier 505 for amplifying the audio signal outputted from the selecting switch 504, a recording part 506 for recording the audio signal amplified by the amplifier 505 on a recording medium such as a magnetic tape, a band-pass filter 507 for separating a low-frequency component, such as that shown at L in FIG. 16 referenced previously, from the audio signal generated from the microphone 501, an amplifier 508 for amplifying the signal separated by the band-pass filter 507, a detecting circuit 509 for detecting the low-frequency component signal of the audio signal amplified by the amplifier 508 and outputting the detected signal, a band-pass filter 510 for separating a signal of middle-to-high-frequency component, such as that shown at M in FIG. 16 referenced previously, from the audio signal generated from the microphone 501, an amplifier 511 for amplifying the signal separated by the band-pass filter 510, a detecting circuit 512 for detecting the middle-to-high-frequency component signal of the audio signal amplified by the amplifier 511 and outputting the detected signal, a comparing circuit 513 for comparing the detected signal outputted from the detecting circuit 509 with the detected signal outputted from the detecting circuit 512 and outputting a signal corresponding to the comparison result, a wind-noise detecting circuit 514 for informing the next-stage display part 515 of the occurrence of wind noise to cause the display part 515 to display a warning indication if the level of the signal outputted from the comparing circuit 513 exceeds a predetermined threshold successively for a predetermined period, and the display part 515 for performing warning indication according to an instruction from the wind-noise detecting circuit 514.

In the arrangement shown in FIG. 40, the sound collected by the microphone 501 is converted into an electrical signal (i.e., an audio signal) and is then supplied to the filters 502 and 503 and to the band-pass filters 507 and 510.

As shown in FIG. 4 referenced previously, except for special cases, the frequency characteristic of the signal outputted from the microphone 501 shows a distribution in which the frequency characteristic of the sound is distributed over a frequency range centered at approximately 1 kHz. To eliminate the influence of wind noise, typical sound amplifying circuits in tape recorders or the like are arranged to attenuate the signal component of the wind noise, as shown by W' in FIG. 6, by attenuating the portion of the audio signal which is 100 Hz or lower, as shown in FIG. 6 referenced previously.

However, since the frequency characteristic of the wind noise is distributed up to a frequency of 100 Hz or higher, if the portion of the audio signal which is 100 Hz or lower is attenuated, the high-frequency component of the wind noise which may have a frequency band of, for example, 50–200 Hz will remain unattenuated and the quality of the sound to be recorded will be degraded.

In the twentieth embodiment, as shown in FIG. 16 referenced previously, the low-frequency band (shown at L in FIG. 16) and the middle-to-high-frequency band (shown at M in FIG. 16) of the sound to be recorded are extracted from the audio signal outputted from the microphone 501, and the extracted signals are compared. On the basis of the result of the comparison, it is determined whether the signal outputted from the microphone 501 contains a wind-noise component. If any wind-noise component is contained, the display part 515 normally gives an operator a warning to switch the connection of the selecting switch 504 from the shown terminal a to the shown terminal b so that the state of supplying the audio signal generated from the microphone 501 to the recording part 506 through the filter 502 having the signal-pass band shown at A in FIG. 41 referenced previously can be switched to the state of supplying the audio signal generated from the microphone 501 to the recording part 506 through the filter 503 which has a low-frequency-component attenuation effect higher than the filter 502 as shown at B in FIG. 41, thereby reducing the influence of the wind-noise component.

The aforesaid processing operation will be described below in more detail.

The signal of frequency band shown at L in FIG. 16 is extracted by the band-pass filter 507 of FIG. 40 from the audio signal supplied from the microphone 501, and the extracted signal is amplified by the next-stage amplifier 508 and is then supplied to the detecting circuit 509.

The detecting circuit 509 detects the signal of frequency band shown at L in FIG. 16 which has been extracted by the band-pass filter 507, and outputs the detected signal to the comparing circuit 513.

The signal of frequency band shown at M in FIG. 16 is extracted by the band-pass filter 510 from the audio signal supplied from the microphone 501, and the extracted signal is amplified by the next-stage amplifier 511 and is then supplied to the detecting circuit 512.

The detecting circuit 512 detects the signal of frequency band shown at M in FIG. 16 which has been extracted by the band-pass filter 510, and outputs the detected signal to the comparing circuit 513.

The comparing circuit 513 compares the detected signals outputted from the respective detecting circuits 509 and 512 and subtracts the level of the detected signal outputted from the detecting circuit 512 from the level of the detected signal outputted from the detecting circuit 509, thereby forming a comparison signal. The comparison signal is supplied to the wind-noise detecting circuit 514.

If the level of the comparison signal supplied from the comparing circuit 513 exceeds the predetermined threshold successively for a predetermined period (for example, approximately one second), the wind-noise detecting circuit 514 determines that a wind-noise signal component chiefly including a low-frequency component is contained in the audio signal generated from the microphone 501, and generates a warning indication command signal to cause the display part 515 to display a warning indication while the level of the comparison signal is in excess of the aforesaid threshold.

While the warning indication command signal is being generated from the wind-noise detecting circuit 514, the display part 515 displays a warning indication representing that the microphone 501 is picking up wind noise.

The aforesaid warning indication by the display part 515 may be provided by lighting up an LED. If the arrangement of the twentieth embodiment is incorporated in a video camera, such a warning indication may be displayed within the viewfinder of the video camera, and if the viewfinder is an electronic viewfinder, warning-message characters may be superimposed on an image displayed in an imaging monitor. In any case, the operator can readily confirm the warning indication.

If the warning indication is provided by the display part 515, since the operator can readily determine that the microphone 501 is picking up wind noise, he/she may switch the connection of the selecting switch 504 from the terminal-a side to the terminal-b side to switch a normal state corresponding to the terminal-a side to a state corresponding to the terminal-b side, whereby the wind-noise signal component (W" in FIG. 7) contained in the audio signal is attenuated as shown in FIG. 7 referenced previously so that the influence of the wind noise on the sound can be reduced. In the normal state corresponding to the terminal-a side, the selecting switch 504 is connected to the terminal-a side, and the audio signal generated from the microphone 501 is passed through the filter 502 having the signal-pass characteristic shown at A in FIG. 41 and is then supplied to the amplifier 505 with its low-frequency component remaining substantially unattenuated. After having been amplified, the audio signal is recorded on the recording medium such as a magnetic tape in the recording part 506. In the state corresponding to the terminal-b side, the selecting switch 504 is connected to the terminal-b side, and the audio signal generated from the microphone 501 is passed through the filter 503 having a signal-pass characteristic which has a low-frequency-component attenuation effect higher than the filter 502 as shown at B in FIG. 41, and its low-frequency component containing a wind-noise signal component is sufficiently attenuated. After such a sufficient attenuation, the audio signal is supplied to and amplified by the amplifier 505, and is then recorded on the recording medium in the recording part 506.

The display operation performed in the display part 515 will be described below in more detail.

Figure 42:
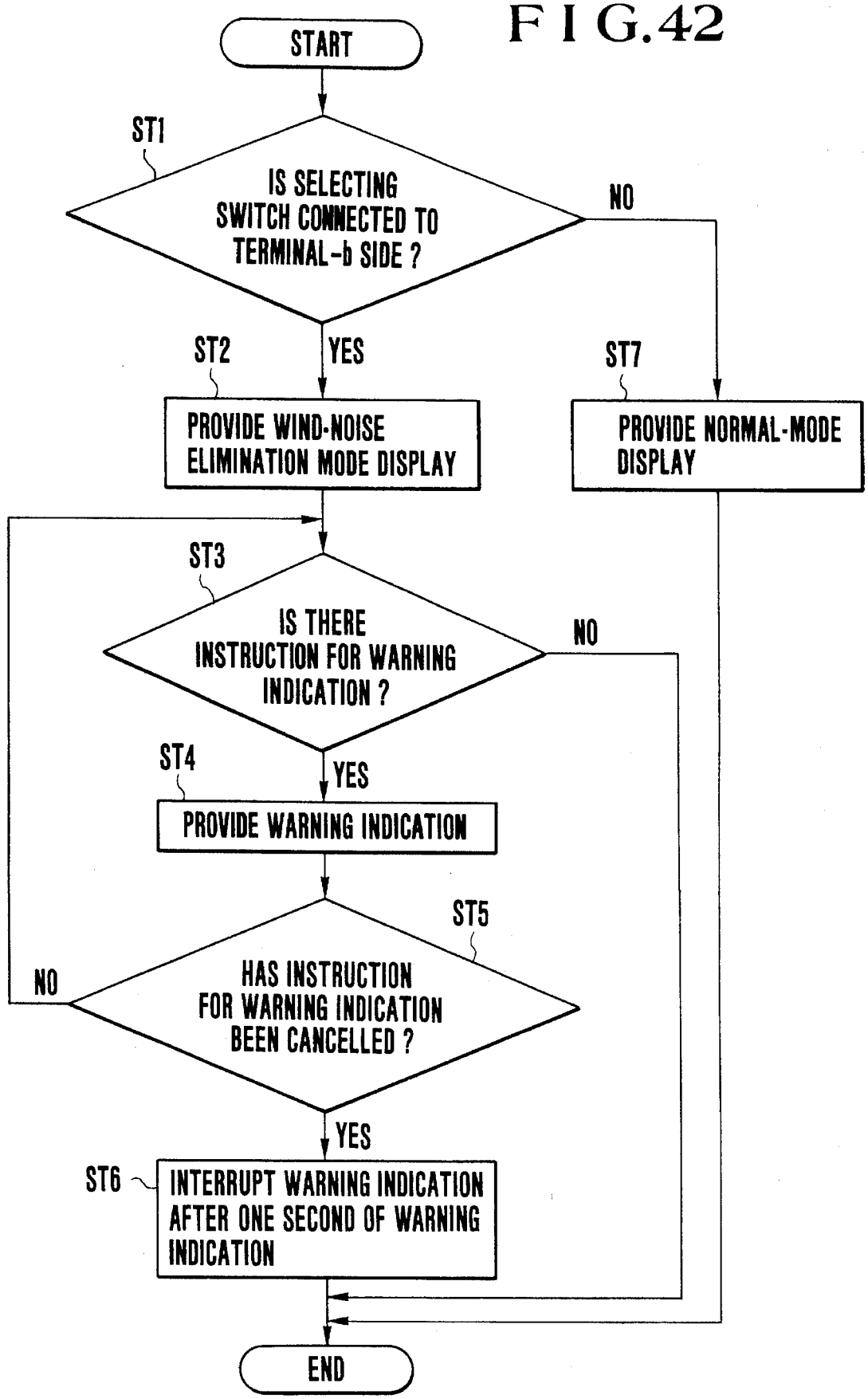
FIG. 42 is a operational flowchart showing the display-controlling operation of a display part in the sound recording part shown in FIG. 40.

The display part 515 of FIG. 40 includes a microcomputer for processing the display operation, and the microcomputer controls the display operation on the basis of the flowchart shown in FIG. 42.

Referring to FIG. 42, first, it is determined whether the selecting switch 504 of FIG. 40 is connected to the terminal-a side or to the terminal-b side (Step ST1). If the selecting switch 504 is connected to the terminal-a side, a normal-mode indication is provided which represents that a normal mode is selected in which an audio signal generated from the microphone 501 of FIG. 40 is recorded on the recording medium through the filter 502 (Step ST7). If the selecting switch 504 is connected to the terminal-b side, a wind-noise elimination mode indication is provided which represents that a wind-noise elimination mode is selected in which an audio signal generated from the microphone 501 is recorded on the recording medium through the filter 503 (Step ST2).

In a case where the aforesaid wind-noise elimination mode is selected, if a warning indication command is sent from the wind-noise detecting circuit 514, the display part 515 provides a warning indication which represents that a wind-noise signal component chiefly having a low-frequency component is contained in the audio signal generated from the microphone 501. The warning indication is continued until the execution of the warning indication command is interrupted by the wind-noise detecting circuit 514 (Steps ST3 to ST5).

If the execution of the warning indication command is interrupted by the wind-noise detecting circuit 514, the warning indication is interrupted after it has been displayed by one second from the interruption of the execution of the warning indication command (Step ST6).

As described above, in the twentieth embodiment, the levels of the detected signals of the respective low- and middle-frequency bands of an audio signal outputted from the microphone are compared to detect whether a wind-noise signal component of predetermined level or higher is contained in the audio signal outputted from the microphone. If such a wind-noise signal component is contained, the warning indication is provided so that the operator can be instructed to perform switching of the filter so as to attenuate the low-frequency band of the audio signal generated from the microphone which band chiefly contains the window-noise signal component. Accordingly, the operator need not monitor the sound carried by the audio signal generated from the microphone, and if the warning indication is given, he/she needs only to perform switching of the filter. Accordingly, even if, for example, AGC is applied before the audio signal is recorded on the recording medium, the level of the audio signal component to be recorded can be prevented from attenuating by the influence of the wind-noise signal component. It is, therefore, possible to prevent deterioration of sound due to wind noise by means of a simple operation.

As is apparent from the foregoing description, according to the twentieth embodiment, it is possible to provide a sound processing device which is capable of easily processing sound without suffering the influence of wind noise or the like, without the need to increase the size of the device and by means of a simple arrangement and construction.

Figure 43:
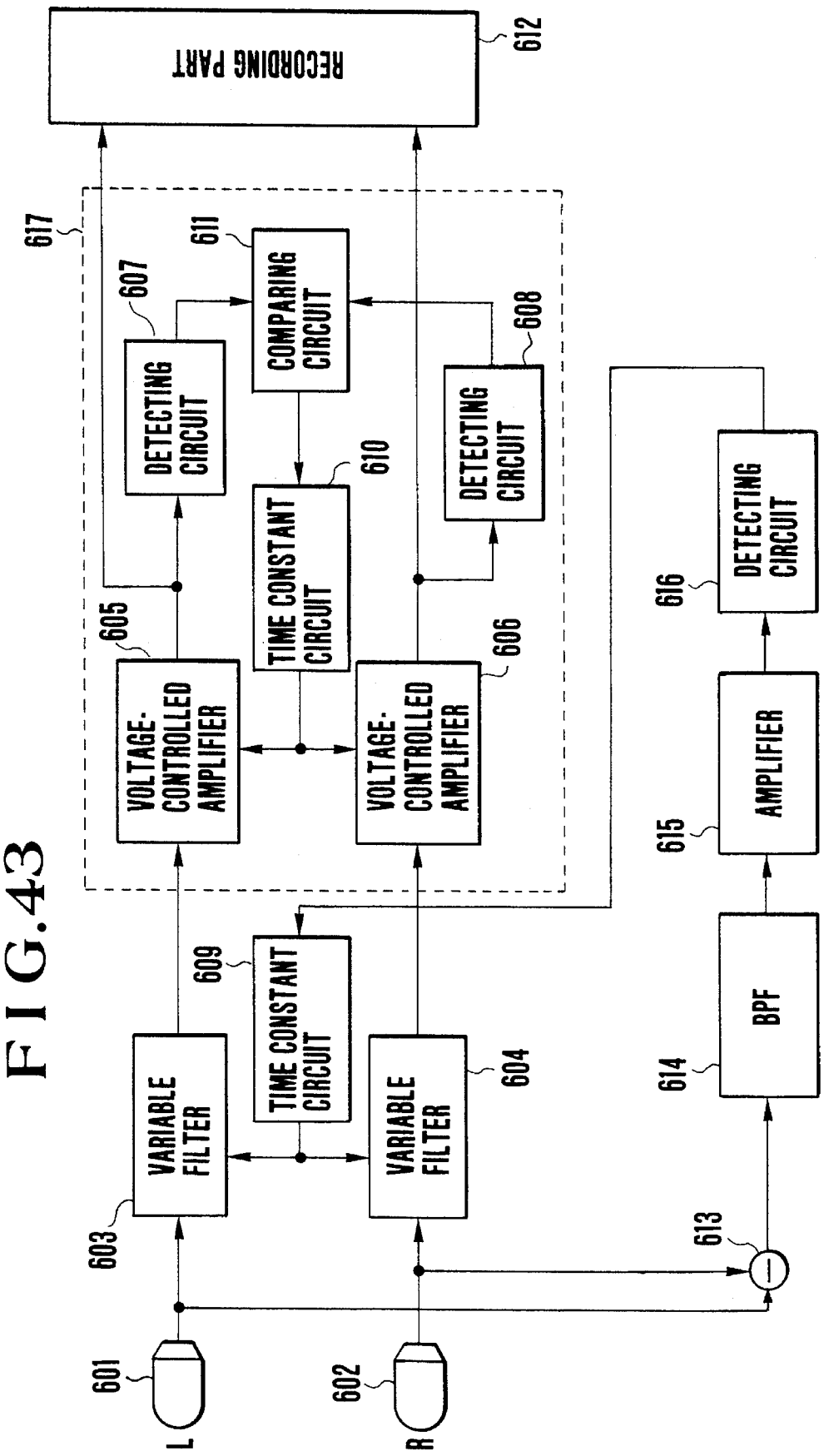
FIG. 43 is a block diagram schematically showing the arrangement and construction of a sound recording device according to a twenty-first embodiment of the present invention.

FIG. 43 is a block diagram schematically showing the arrangement and construction of a sound recording device according to a twenty-first embodiment of the present invention.

The arrangement shown in FIG. 43 includes microphones 601 and 602 for converting sound into electrical signals (i.e., audio signals), respectively, and the microphone 601 serves as a left-side microphone and the microphone 602 as a right-side microphone.

The arrangement also includes variable filters 603 and 604 for varying the frequency characteristics of audio signals generated from the respective microphones 601 and 602, an AGC (Automatic Gain Control) circuit 617 for amplifying the audio signals outputted from the variable filters 603 and 604, the AGC circuit 617 being made up of voltage-controlled amplifiers 605 and 606, detecting circuits 607 and 608, a time constant circuit 610 and a comparing circuit 611, a recording part 612 for recording the audio signal level-limited by the AGC 617 on a recording medium such as a magnetic tape, a subtracter 613 for forming a difference signal from the audio signals outputted from the respective microphones 601 and 602, a band-pass filter (BPF) 614 for extracting a low-frequency component from the difference signal outputted from the subtracter 613, an amplifier 615 for amplifying the low-frequency component of the difference signal extracted by the BPF 614, a detecting circuit 616 for detecting the low-frequency component of the difference signal which has been amplified by the amplifier 615, and outputting the low-frequency detected signal, and a time constant circuit 609 for setting an attack recovery time to prevent variations in the frequency characteristic of the respective audio signals from leading to substantial impairment in auditory sound quality when the frequency characteristics of the audio signals are varied by the respective variable filters 603 and 604 whose frequency-varying characteristics are controlled according to the low-frequency detected signal outputted from the detecting circuit 616.

In the arrangement shown in FIG. 43, the sounds collected by the respective microphones 601 and 602 are converted into electrical signals (i.e., audio signals). The electrical signal from the microphone 601 is supplied to the variable filter 603 and to the subtracter 613, while the electrical signal from the microphone 602 is supplied to the variable filter 604 and to the subtracter 613.

The subtracter 613 forms a difference signal from the audio signals supplied from the respective microphones 601 and 602, and the low-frequency component of the difference signal is extracted in the BPF 614 and supplied to the amplifier 615.

The low-frequency component of the difference signal which has been amplified by the amplifier 615 is supplied to the detecting circuit 616, and the level of the low-frequency component of the difference signal is detected by the detecting circuit 616 and is then supplied to the time circuit 609 as a low-frequency detected signal.

Each of the audio signals outputted from the microphones 601 and 602 has a frequency spectrum such as that shown in FIG. 4 referenced previously. In FIG. 4, the curve A indicates the frequency spectrum distribution of sound to be recorded (hereinafter referred to as "general sound"), and the curve W indicates the frequency spectrum distribution of sound representative of wind noise (hereinafter referred to as "wind noise").

As shown in FIG. 4 referenced previously, except for special cases, the characteristic spectrum of the general sound is distributed over a frequency range centered at approximately 1 kHz and the frequency spectrum of the wind noise is distributed over a low-frequency range which is 200 Hz or lower.

Figure 44:
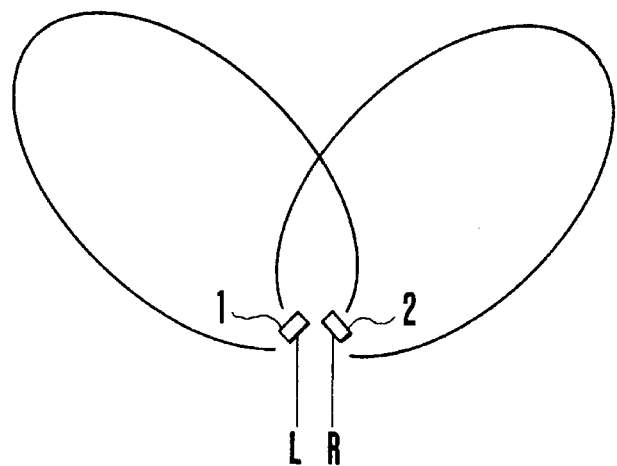
FIG. 44 is an illustration showing a polar pattern of 1 kHz which is obtainable when two microphones are arranged as a one-point stereophonic microphone in the sound recording device shown in FIG. 43.

FIG. 44 is a view showing a polar pattern of 1 kHz obtainable when the microphones 601 and 602 are arranged as a one-point stereophonic microphone.

As shown, the left-side microphone 601 has directivity relative to the forward left and the right-side microphone 602 has directivity relative to the forward right.

Figure 45:
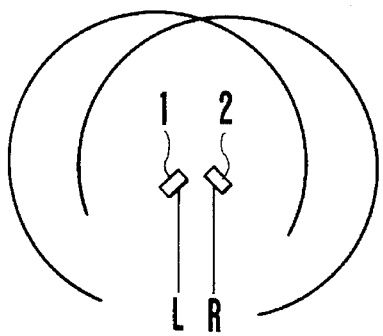
FIG. 45 is an illustration showing a polar pattern of 30 Hz which is obtainable when the two microphones are arranged as the one-point stereophonic microphone in the sound recording device shown in FIG. 43.

FIG. 45 is a view showing a different polar pattern of the one-point stereophonic microphone, the frequency of which is lower than that of the polar pattern of FIG. 44, for example, 30 Hz. As shown, when compared to the 1-kHz polar pattern shown in FIG. 44, the directivity of the stereophonic microphone becomes dull and approaches that of a monophonic microphone. As a result, the correlation between the audio signals outputted from the respective microphones 601 and 602 becomes high.

As can be seen from the frequency spectrum distributions of the respective sound and wind noise as well as the directivity characteristics of the respective microphones, the correlation between the audio signals outputted from the respective microphones 601 and 602 becomes high for a low-frequency general sound. Accordingly, if a low-frequency component is extracted by the BPF 614 from the difference signal of the output audio signals of the microphones 601 and 602 which is outputted from the subtracter 613 of FIG. 43, the level of the signal extracted by the BPF 614 becomes low. However, for a low-frequency wind noise generated by wind blowing against the microphones, the correlation between the audio signals outputted from the two respective microphones 601 and 602 becomes low, and the level of the low-frequency component of the difference signal extracted through the subtracter 613 and the BPF 614 becomes high.

Figure 46:
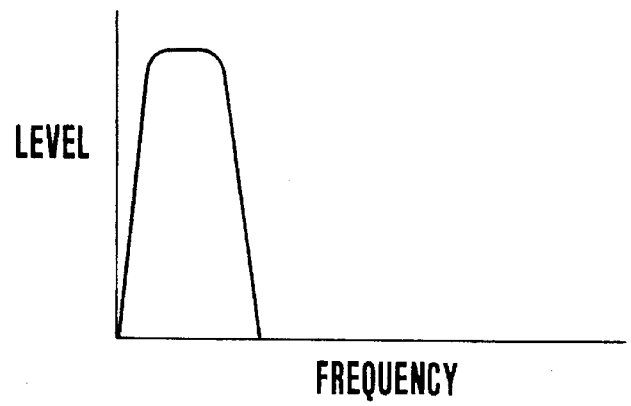
FIG. 46 is an illustration showing the pass frequency characteristic of a band-pass filter in the sound recording device shown in FIG. 43.

In the twenty-first embodiment, as shown in FIG. 43, a difference signal of the audio signals outputted from the respective microphones 601 and 602 is formed by the subtracter 613, and the formed difference signal is supplied to the BPF 614 having the low-frequency pass band shown in FIG. 46. The signal outputted from the BPF 614 is amplified by the amplifier 615, and a low-frequency detected signal is obtained by detection in the detecting circuit 616. On the basis of the level of the low-frequency detected signal, the signal-pass characteristic of each of the variable filters 603 and 604 which are being supplied with the audio signals generated from the respective microphones 601 and 602 is controlled in such a manner that the amounts of attenuation of the respective low-frequency signals are varied as shown in FIG. 2 referenced previously or that the cut-off frequencies of the respective low-frequency bands are varied as shown in FIG. 3 referenced previously. Accordingly, since the gains of the variable filters 603 and 604 relative to the low-frequency components of the respective audio signals can be controlled in response to low-frequency wind noise but insensitively to low-frequency general sound, whereby only the influence of the wind noise can be eliminated.

The low-frequency detected signal outputted from the detecting circuit 616 in the above-described manner is supplied to the time constant circuit 609. The time constant circuit 609 integrates by a capacitor or the like the low-frequency detected signal supplied from the detecting circuit 616. If the level of the integrated signal exceeds a predetermined threshold, the time constant circuit 609 causes the band-pass characteristics of the respective variable filters 603 and 604 to vary continuously in the direction in which the low-frequency components are attenuated, according to the level of the integrated signal, and also causes the capacitor to discharge. Thus, the variable filters 603 and 604 can attenuate the wind-noise signal components contained in the respective audio signals, thereby preventing substantial impairment in auditory sound quality.

Then, the audio signals whose wind-noise signal components have been attenuated in the respective variable filters 603 and 604 are level-limited so as not to exceed predetermined levels by the AGC circuit 617, and the resultant signals are recorded on the recording medium such as a magnetic tape in the recording part 612.

The AGC circuit 617, as shown in FIG. 43, is made up of the voltage-controlled amplifiers 605 and 606, the detecting circuits 607 and 608, the comparing circuit 611 and the time constant circuit 610. The audio signals supplied from the variable filters 603 and 604 are respectively amplified by the voltage-controlled amplifiers 605 and 606 and are then supplied to the recording part 612. The audio signals outputted from the voltage-controlled amplifiers 605 and 606 are also supplied to the associated detecting circuits 607 and 608. The detected signals formed by detection in the respective detecting circuits 607 and 608 are supplied to the comparing circuit 611.

The comparing circuit 611 compares the levels of the detected signals supplied from the respective detecting circuits 607 and 608, and supplies the detected signal of the higher level to the voltage-controlled amplifiers 605 and 606 via the time constant circuit 610 as control signals for the voltage-controlled amplifiers 605 and 606.

If the levels of the supplied detected signals exceed corresponding predetermined levels, the voltage-controlled amplifiers 605 and 606 lower their respective gains relative to the input audio signals. Thus, the amplified signals which have been level-limited so as not to exceed the respective predetermined levels are outputted from the respective voltage-controlled amplifiers 605 and 606 to the recording part 612.

The time constant circuit 610 supplies the detected signal outputted from the comparing circuit 611 to the+voltage-controlled amplifiers 605 and 606 with a predetermined time constant so that the levels of the audio signals can be limited by the voltage-controlled amplifiers 605 and 606 so as not to cause substantial impairment in auditory sound quality.

As described above, the twenty-first embodiment is arranged such that the frequency characteristics of the respective variable filters which attenuate the low-frequency components in the audio signals outputted from the two respective microphones are varied according to the level of the low-frequency component of the difference signal of such audio signals. Accordingly, it is possible to attenuate the low-frequency signal components contained in the respective audio signals in response to low-frequency wind noise but insensitively to low-frequency general sound, whereby it is possible to prevent the wind-noise signal components contained in the respective audio signals from standing out auditorily. In addition, even if AGC is applied before the audio signals are recorded on the recording medium, the level of the general sound signal can be prevented from attenuating by the influence of the wind-noise signal component.

FIG. 47 is a block diagram schematically showing the arrangement and construction of a sound recording device according to a twenty-second embodiment of the present invention.

In FIG. 47, the same reference numerals are used to denote elements which are similar to those of the twenty-first embodiment shown in FIG. 43, and a detailed description thereof is omitted.

The arrangement shown in FIG. 47 includes an adder 618 for forming a sum signal of the audio signals outputted from the respective microphones 601 and 602, a BPF 619 for extracting the middle-frequency component of the sum signal outputted from the adder 618, an amplifier 620 for amplifying the middle-frequency component of the sum signal extracted by the BPF 619, a detecting circuit 621 for detecting the middle-frequency component of the sum signal amplified by the amplifier 620 and outputting the middle-frequency signal, and a comparing circuit 622 for comparing the middle-frequency detected signal outputted from the detecting circuit 621 with the low-frequency detected signal outputted from the detecting circuit 616 and outputting a signal corresponding to the comparison result. The signal outputted from the comparing circuit 622 is supplied to the variable filters 603 and 604 through the time constant circuit 609.

In the twenty-first embodiment, whether wind-noise signal components are contained in the audio signals outputted from the respective microphones 601 and 602 is detected by detecting only the level of the low-frequency component of the difference signal of the audio signals outputted from the respective microphones 601 and 602. However, in the twenty-second embodiment, to reliably prevent a general-sound signal of low frequency from being erroneously detected as a wind-noise signal component, the difference signal of the audio signals outputted from the two respective microphones 601 and 602 is formed by the subtracter 613, and a sum signal of such audio signals is formed by the adder 618. A low-frequency component is extracted from the formed difference signal by the BPF 614 having the low-frequency pass band shown at L in FIG. 16 referenced previously, while a middle-frequency component signal is extracted from the formed sum signal by the BPF 619 having the middle-frequency pass band shown at M in FIG. 16. The low-frequency component of the difference signal and the middle-frequency component of the sum signal are respectively amplified by the amplifiers 615 and 620 and are then detected by the detecting circuits 616 and 621. The comparing circuit 622 compares the level of the low-frequency detected signal of the difference signal with the level of the middle-frequency detected signal of the sum signal, and a signal corresponding to the comparison result is supplied to the variable filters 602 and 603 through the time constant circuit 609. Thus, if the comparing circuit 622 detects that the level of the low-frequency detected signal of the difference signal is higher than the level of the middle-frequency detected signal of the sum signal by a predetermined level or more, the frequency characteristics of the respective variable filters 603 and 604 are varied so that the low-frequency components of the respective audio signals are attenuated.

In a case where the level of the middle-frequency detected signal of the sum is higher, even if the low-frequency detected signal of the difference signal due to the wind noise shows a certain degree of level, it is determined that the level of the general-sound signal is high, and the frequency characteristics of the variable filters 603 and 604 are not changed. Accordingly, it is possible to record the general sound signal irrespective of the influence of the wind noise.

As described above, the aforesaid twenty-second embodiment is arranged to extract the low-frequency component signal of the difference signal of, and the middle-frequency component signal of the sum signal of, the audio signals outputted from the two respective microphones 601 and 602, thereby controlling the frequency characteristics of the variable filters which attenuate the low-frequency components in the respective audio signals, according to the difference between the detected signal levels of the low- and middle-frequency components. The characteristics of the respective variable filters may be controlled on the basis of the difference in level between the detected signal of the low-frequency component of the difference signal and the detected signal of the middle-to-high-frequency component of the sum signal or on the basis of the result of a comparison between the level of the detected signal of the low-frequency component of the difference signal, the level of the detected signal of the middle-frequency component of the sum signal, and the level of the detected signal of the high-frequency component of the sum signal.

As is apparent from the foregoing description, the twenty-second embodiment is arranged such that the frequency characteristics of the respective variable filters which attenuate the low-frequency components in the audio signals outputted from the two respective microphones are varied according to the level of the low-frequency component of the difference signal of such audio signals. Accordingly, it is possible to prevent the wind-noise signal components contained in the respective audio signals from standing out auditorily.

In addition, the twenty-second embodiment is arranged to compare the level of the low-frequency component of the difference signal of, with the level of the middle-frequency component of the sum signal of, the audio signals outputted from the two respective microphones, and if the level of the low-frequency component is higher than the level of the middle-frequency component by a predetermined level or higher, the frequency characteristics of the variable filters which attenuate the low-frequency components of the respective audio signals are varied. Thus, it is possible to prevent malfunction from occurring due to general sound of low frequency during the operation of automatically reducing wind-noise components in the audio signals.

As described above, either of the aforesaid twenty-first or twenty-second embodiments is arranged to automatically reduce wind-noise components in the respective audio signals by varying the frequency characteristics of the two respective variable filters for attenuating the low-frequency components of the respective audio signals, according to the level of the low-frequency component of a difference signal of such audio signals, or by comparing the level of the low-frequency component of the difference signal with that of the middle-frequency component of a sum signal and varying, if the level of the low-frequency component is higher than that of the middle-frequency component, the frequency characteristics of the two respective variable filters for attenuating the low-frequency components of the respective audio signals. Otherwise, instead of the above arrangement for reducing the low-frequency components in the audio signals, an equalizing circuit or the like may be used to raise the middle- and high-frequency components of the audio signals and relatively attenuate the middle- and high-frequency components with respect to the low-frequency components.

As is apparent from the foregoing description, according to either of the twenty-first and twenty-second embodiments, it is possible to provide a sound processing device which is capable of easily processing sound without suffering the influence of wind noise or the like, without the need to increase the size of the device and by means of a simple arrangement and construction.

What is claimed is:

1. A sound processing device for processing sound, comprising:

(A) low-frequency attenuating means for receiving an audio signal as its input, attenuating a low-frequency signal of the input audio signal and outputting a resultant audio signal; and (B) control means for controlling an attenuating characteristic in said low-frequency attenuating means according to a level of a middle-frequency signal of the input audio signal having a frequency zone different from that of a level of the low-frequency signal of the input audio signal and the low-frequency signal.

2. A sound processing device for processing sound, comprising:

(A) low-frequency attenuating means for receiving an audio signal as its input, attenuating a low-frequency signal of the input audio signal and outputting a resultant audio signal; and (B) controlling means for controlling an attenuation characteristic in said low-frequency attenuating means, according to a level of the low-frequency signal of the input audio signal and a level of a middle-frequency signal of the audio signal outputted from said low-frequency attenuating means.

3. A sound processing device for processing sound, comprising:
   (A) frequency-characteristic varying means for receiving an audio signal as its input, varying a frequency characteristic of the input audio signal and outputting a resultant audio signal;
   (B) detecting means for detecting a level of a low frequency component in the input audio signal; and
   (C) control means for controlling a variable characteristic in said frequency-characteristic varying means, according to a level of a middle-frequency component of the input audio signal having a frequency zone different from that of a level of a low-frequency component of the input audio signal detected by said detecting means and the low-frequency component.

4. A sound processing device for processing sound, comprising:
   (A) frequency-characteristic varying means for receiving an audio signal as its input, varying a frequency characteristic of the input audio signal and outputting a resultant audio signal; and
   (B) controlling means for controlling a variation characteristic in said frequency-characteristic varying means, according to a level of a low-frequency component of the input audio signal and a level of a middle-frequency component of the audio signal outputted from said frequency-characteristic varying means.

5. A sound processing device for processing sound, comprising:
   (A) frequency-characteristic varying means for receiving an audio signal as its input, varying a frequency characteristic of the input audio signal and outputting a resultant audio signal;
   (B) detecting means for detecting a level of a low frequency component of the input audio signal; and
   (C) control means for comparing a level of a low frequency component in the input audio signal detected by said detecting means with a level of another frequency component in said input audio signal to control a variable characteristic in said frequency-characteristic varying means according to a comparison result.

6. A sound processing device for processing sound, comprising:
   (A) first low-frequency attenuating means for receiving a first audio signal as its input, attenuating a low-frequency signal of the input first audio signal and outputting a resultant audio signal;
   (B) second low-frequency attenuating means for receiving a second audio signal as its input, attenuating a low-frequency signal of the input second audio signal and outputting a resultant audio signal; and
   (C) control means for controlling attenuation characteristics in said respective first and second low-frequency attenuating means according to levels of middle-frequency signals of the respective input first and second audio signals having a frequency zone different from that of levels of the low-frequency signals of the respective first and second input audio signals and the low-frequency signals.

7. A sound processing device for processing sound, comprising:
   (A) first low-frequency attenuating means for receiving a first audio signal as its input, attenuating a low-frequency signal of the input first audio signal and outputting a resultant audio signal;
   (B) second low-frequency attenuating means for receiving a second audio signal as its input, attenuating a low-frequency signal of the input second audio signal and outputting a resultant audio signal; and
   (C) controlling means for controlling attenuation characteristics in said respective first and second low-frequency attenuating means, according to levels of the low-frequency signals of the respective input first and second audio signals and levels of middle-frequency signals of the respective first and second audio signals outputted from said first and second low-frequency attenuating means.

8. A sound processing device for processing sound, comprising:
   (A) first low-frequency attenuating means for receiving a first audio signal as its input, attenuating a low-frequency signal of the input first audio signal and outputting a resultant audio signal;
   (B) second low-frequency attenuating means for receiving a second audio signal as its input, attenuating a low-frequency signal of the input second audio signal and outputting a resultant audio signal;
   (C) adding means for forming and outputting a sum signal of the first audio signal outputted from said first low-frequency attenuating means and the second audio signal outputted from said second low-frequency attenuating means;
   (D) subtracting means for forming and outputting a difference signal of the first audio signal outputted from said first low-frequency attenuating means and the second audio signal outputted from said second low-frequency attenuating means; and
   (E) controlling means for controlling attenuation characteristics in said respective first and second low-frequency attenuating means, according to levels of the respective low-frequency signals of the input first and second audio signals and a level of a middle-frequency signal of the sum signal outputted from said adding means.

9. A sound processing device for processing sound, comprising:
   (A) first frequency-characteristic varying means for receiving a first audio signal as its input, varying a frequency characteristic of the input first audio signal and outputting a resultant audio signal;
   (B) second frequency-characteristic varying means for receiving a second audio signal as its input, varying a frequency characteristic of the input second audio signal and outputting a resultant audio signal; and
   (C) control means for controlling a variable characteristic of said first frequency-characteristic varying means according to levels of a low-frequency component in said first audio signal, and for controlling a variable characteristic of said second frequency characteristic varying means according to a level of a low frequency component in said second audio signal and a middle-frequency component in said second audio signal having a frequency zone different from that of the low-frequency component in said second audio signal.

10. A sound processing device for processing sound, comprising:
   (A) first frequency-characteristic varying means for receiving a first audio signal as its input, varying a frequency characteristic of the input first audio signal and outputting a resultant audio signal;

(B) second frequency-characteristic varying means for receiving a second audio signal as its input, varying a frequency characteristic of the input second audio signal and outputting a resultant audio signal; and (C) controlling means for controlling variation characteristics in said respective first and second frequency-characteristic varying means, according to levels of low-frequency components of the respective input first and second audio signals and levels of middle-frequency components of the respective first and second audio signals outputted from said first and second frequency-characteristic varying means.

11. A sound processing device for processing sound, comprising:

(A) first frequency-characteristic varying means for receiving a first audio signal as its input, varying a frequency characteristic of the input first audio signal and outputting a resultant audio signal;

(B) second frequency-characteristic varying means for receiving a second audio signal as its input, varying a frequency characteristic of the input second audio signal and outputting a resultant audio signal;

(C) adding means for forming and outputting a sum signal of the first audio signal outputted from said first frequency-characteristic varying means and the second audio signal outputted from said second frequency-characteristic varying means;

(D) subtracting means for forming and outputting a difference signal of the first audio signal outputted from said first frequency-characteristic varying means and the second audio signal outputted from said second frequency-characteristic varying means; and (E) controlling means for controlling variation characteristics in said respective first and second frequency-characteristic varying means, according to levels of low-frequency components of the respective input first and second audio signals and a level of a middle-frequency component of the sum signal outputted from said adding means.

12. A sound processing device for processing sound, comprising:

(A) first frequency-characteristic varying means for receiving a first audio signal as its input, varying a frequency characteristic of the input first audio signal and outputting a resultant audio signal;

(B) second frequency-characteristic varying means for receiving a second audio signal as its input, varying a frequency characteristic of the input second audio signal and outputting a resultant audio signal; and (C) controlling means for controlling characteristics of said respective first and second frequency-characteristic varying means, according to a level of a low-frequency component of a difference signal of the input first and second audio signals and to a level of a middle-frequency component of a sum signal of the input first and second audio signals.

13. A sound processing device for processing sound, comprising:

(A) first frequency-characteristic varying means for receiving a first audio signal as the input of said first frequency-characteristic varying means, varying a frequency characteristic of the input first audio signal and outputting a resultant audio signal;

(B) second frequency-characteristic varying means for receiving a second audio signal as the input of said second frequency-characteristic varying means, varying a frequency characteristic of the input second audio signal and outputting a resultant audio signal; and (C) controlling means for controlling characteristics of said respective first and second frequency-characteristic varying means, according to a level of a low-frequency component of a difference signal of the input first and second audio signals.

* * * * *